United States Patent
Nosaka

(10) Patent No.: US 10,715,112 B2
(45) Date of Patent: Jul. 14, 2020

(54) FILTER DEVICE, RADIO-FREQUENCY FRONT-END CIRCUIT, AND COMMUNICATION APPARATUS

(71) Applicant: Murata Manufacturing Co., Ltd., Kyoto (JP)

(72) Inventor: Koji Nosaka, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/278,944

(22) Filed: Feb. 19, 2019

(65) Prior Publication Data

US 2019/0181838 A1 Jun. 13, 2019

Related U.S. Application Data

(63) Continuation of application No. PCT/JP2017/029310, filed on Aug. 14, 2017.

(30) Foreign Application Priority Data

Aug. 23, 2016 (JP) .................................. 2016-163034

(51) Int. Cl.
  H03H 9/72 (2006.01)
  H03H 7/01 (2006.01)
  (Continued)

(52) U.S. Cl.
  CPC ............ H03H 9/72 (2013.01); H03H 7/0161 (2013.01); H03H 7/38 (2013.01); H03H 7/461 (2013.01);
  (Continued)

(58) Field of Classification Search
  CPC .. H03H 9/72; H03H 7/01; H03H 9/64; H03H 7/46
  (Continued)

(56) References Cited

U.S. PATENT DOCUMENTS 6,472,953 B1 10/2002 Sakuragawa et al.
9,660,611 B2 * 5/2017 Burgener ............... H03H 9/542
(Continued)

FOREIGN PATENT DOCUMENTS

JP  2000-323961 A  11/2000
JP  2004-140696 A   5/2004
(Continued)

OTHER PUBLICATIONS

International Search Report for International Application No. PCT/JP2017/029310, dated Nov. 7, 2017.
Written Opinion for International Application No. PCT/JP2017/029310, dated Nov. 7, 2017.

Primary Examiner — Dean O Takaoka
(74) Attorney, Agent, or Firm — Pearne & Gordon LLP

(57) ABSTRACT

A filter device includes a filter (22A) connected to a common terminal (110) and having a first characteristic, a variable filter (22B) connected to the common terminal (110) and capable of changing a characteristic to one of a second characteristic and a third characteristic, and a switch (23). In the second characteristic, a second pass band including an overlapping band in which the second pass band and an attenuation band of the filter (22A) partially overlap in frequency is defined. Insertion loss within the overlapping band for the third characteristic is greater than insertion loss within the overlapping band for the second characteristic. When the filter (22A) is selected by the switch (23), the characteristic of the variable filter (22B) is set to the third characteristic.

19 Claims, 26 Drawing Sheets

(51) Int. Cl.
    *H03H 9/64*     (2006.01)
    *H03H 7/46*     (2006.01)
    *H03H 9/60*     (2006.01)
    *H03H 9/145*     (2006.01)
    *H03H 9/70*     (2006.01)
    *H04B 1/00*     (2006.01)
    *H03H 9/54*     (2006.01)
    *H03H 7/38*     (2006.01)

(52) U.S. Cl.
    CPC ........ *H03H 9/14541* (2013.01); *H03H 9/542* (2013.01); *H03H 9/605* (2013.01); *H03H 9/6403* (2013.01); *H03H 9/6483* (2013.01); *H03H 9/706* (2013.01); *H03H 9/725* (2013.01); *H04B 1/00* (2013.01); *H04B 1/006* (2013.01); *H04B 1/0057* (2013.01); *H03H 2210/036* (2013.01)

(58) Field of Classification Search
    USPC ........................................................ 333/100
    See application file for complete search history.

(56) References Cited

U.S. PATENT DOCUMENTS

| | | |
|---|---|---|
| 2009/0201104 A1 | 8/2009 | Ueda et al. |
| 2012/0313731 A1 | 12/2012 | Burgener et al. |
| 2013/0113576 A1 | 5/2013 | Inoue et al. |
| 2016/0301379 A1* | 10/2016 | Ikada .................... H03H 7/465 |
| 2016/0344370 A1* | 11/2016 | Tani ....................... H03H 7/075 |

FOREIGN PATENT DOCUMENTS

| | | |
|---|---|---|
| JP | 2006-254281 A | 9/2006 |
| JP | 2009-130831 A | 6/2009 |
| JP | 2009-207116 A | 9/2009 |
| JP | 2013-118611 A | 6/2013 |
| JP | 2014-502803 A | 2/2014 |
| JP | 2016-054374 A | 4/2016 |
| WO | 2015/098791 A1 | 7/2015 |
| WO | 2017/138540 A1 | 8/2017 |

* cited by examiner

B68Rx/B28+20Rx

B27Rx/B26Rx/B20Tx-EXCLUDED

BANDPASS CHARACTERISTIC OF VARIABLE FILTER 24A - B68Rx SELECTED (MODE a1)
—— VARIABLE FILTER 24B - B27Rx SELECTED (MODE b1)
----- VARIABLE FILTER 24B - B26Rx SELECTED (MODE b2)
—·— VARIABLE FILTER 24B - B20Tx-EXCLUDED (MODE b3)

BANDPASS CHARACTERISTIC OF VARIABLE FILTER 24A - B28+20Rx SELECTED (MODE a2)
—— VARIABLE FILTER 24B - B27Rx SELECTED (MODE b1)
----- VARIABLE FILTER 24B - B26Rx SELECTED (MODE b2)
—·— VARIABLE FILTER 24B - B20Tx-EXCLUDED (MODE b3)

BANDPASS CHARACTERISTIC OF VARIABLE FILTER 24B - B27Rx SELECTED (MODE b1)

——— VARIABLE FILTER 24A - B28+20Rx SELECTED (MODE a2)
------ VARIABLE FILTER 24A - B68Rx SELECTED (MODE a1)

BANDPASS CHARACTERISTIC OF VARIABLE FILTER 24B - B26Rx SELECTED (MODE b2)

——— VARIABLE FILTER 24A - B28+20Rx SELECTED (MODE a2)
------ VARIABLE FILTER 24A - B68Rx SELECTED (MODE a1)

------- : SWITCH-ON
―――― : SWITCH-OFF

------- : SWITCH-ON
―――― : SWITCH-OFF

FILTER DEVICE, RADIO-FREQUENCY FRONT-END CIRCUIT, AND COMMUNICATION APPARATUS

This is a continuation of International Application No. PCT/JP2017/029310 filed on Aug. 14, 2017 which claims priority from Japanese Patent Application No. 2016-163034 filed on Aug. 23, 2016. The contents of these applications are incorporated herein by reference in their entireties.

BACKGROUND OF THE DISCLOSURE

Field of the Disclosure

The present disclosure relates to a filter device, a radio-frequency front-end circuit, and a communication apparatus.

Description of the Related Art

Recent cellular phones are required to support a plurality of frequency bands and a plurality of wireless modes, or so-called multi-band and multi-mode capabilities, with a single terminal. To address the requirements, a filter device (multiplexer) is arranged immediately below a single antenna to separate radio-frequency signals having a plurality of radio carrier frequencies. This filter device has a configuration in which a plurality of band pass filters are connected in parallel to each other and connected to an antenna common terminal.

FIG. 20 is a circuit configuration diagram of a branching device described in Patent Document 1. A branching device 501 illustrated in FIG. 20 includes a switch 510, a fixed filter circuit 511, and a variable filter 512. The fixed filter circuit 511 includes filters 511a and 511b having different pass bands, and the filters 511a and 511b are connected in common to an individual terminal Ps12 of the switch 510 via an impedance matching circuit 520. The variable filter 512 is connected to an individual terminal Ps13 of the switch 510. With this configuration, the fixed filter circuit 511 or the variable filter 512 is selected through the switching of the switch 510.

Patent Document 1: International Publication No. 2015/098791

BRIEF SUMMARY OF THE DISCLOSURE

In the branching device 501 described in Patent Document 1, individual terminals P2, P3, and P4 of the respective filters, which are opposite to a common terminal P1, are further provided with a filter switching switch so that the individual terminals P2, P3, and P4 are integrated into a common terminal which is connected to a subsequent circuit such as a low-noise amplifier circuit (LNA) or a power amplifier circuit (PA). In this case, for example, when the filter 511a is being selected, it is ideal to obtain the characteristics of the filter 511a alone. However, if the attenuation band of the filter 511a and the pass band of the variable filter 512 partially overlap, the bandpass characteristic of the variable filter 512 may affect the attenuation characteristic of the filter 511a depending on the isolation of the filter switching switch. In this case, the attenuation characteristic of the filter 511a may deteriorate. One solution to this may be to enhance the isolation of the filter switching switch. However, a large scale circuit may be used for the filter switching switch, and the size of the branching device 501 may be increased, which is problematic.

Accordingly, the present disclosure has been made to address the problem described above, and an object thereof is to provide a filter device, a radio-frequency front-end circuit, and a communication apparatus that include a plurality of filters connected to a common terminal, and a switch circuit configured to switch the plurality of filters and that can be made compact while maintaining good filter characteristics.

To achieve the object described above, a filter device according to an aspect of the present disclosure is a filter device having a common terminal, a first input/output terminal, and a second input/output terminal and including a plurality of filters connected to the common terminal. The filter device includes a first filter arranged between the common terminal and the first input/output terminal and having a first characteristic having a first pass band and a predetermined attenuation band, a second filter arranged between the common terminal and the second input/output terminal and capable of changing a characteristic to one of a second characteristic and a third characteristic, and a switch circuit that switches between a connection of the common terminal, the first filter, and the first input/output terminal to each other and a connection of the common terminal, the second filter, and the second input/output terminal to each other. The second characteristic has a second pass band including an overlapping band in which the second pass band and the first pass band or the predetermined attenuation band at least partially overlap in frequency. Insertion loss within the overlapping band for the third characteristic is greater than insertion loss within the overlapping band for the second characteristic. The characteristic of the second filter is set to the third characteristic when the common terminal, the first filter, and the first input/output terminal are connected to each other by using the switch circuit.

With the configuration described above, when the first filter is selected by the switch circuit, the third characteristic is selected in the second filter although the second filter is not selected. When the third characteristic is selected, compared with when the second characteristic is selected, the leakage of radio-frequency signals within the overlapping band into the second filter through the switch circuit can be suppressed. Thus, the bandpass characteristic or attenuation characteristic of the first filter within the overlapping band can be prevented from deteriorating due to the effect of leaking signals into the second filter. In addition, the second filter is implemented as a variable filter, which eliminates the need to increase the size of the switch circuit to enhance the isolation more than necessary, achieving a reduction in size while maintaining the bandpass characteristic and attenuation characteristic of the first filter.

Further, the first pass band may be one of a transmission band and a reception band of the first filter, the predetermined attenuation band may be another of the transmission band and the reception band of the first filter, and the overlapping band may be a frequency band that at least partially overlaps in frequency with the other of the transmission band and the reception band of the first filter.

Accordingly, when the first filter is selected and when the third characteristic of the second filter is selected, compared with when the second characteristic is selected, the leakage of radio-frequency signals within the overlapping band into the second filter through the switch circuit can be suppressed. Thus, the attenuation characteristic of the first filter within the other of the transmission band and the reception band of the first filter can be prevented from deteriorating due to the effect of leaking signals into the second filter. This can achieve a reduction in size while maintaining the attenuation characteristic of the first filter.

Further, the characteristic of the second filter may be set to the third characteristic when the common terminal, the first filter, and the first input/output terminal are connected to each other by using the switch circuit, and may be set to the second characteristic when the common terminal, the second filter, and the second input/output terminal are connected to each other by using the switch circuit.

Accordingly, when the second filter is selected by the switch circuit, the second characteristic is selected in the second filter. This maintains low loss of the bandpass characteristic of the second filter within the second pass band.

Further, the third characteristic may have a pass band that is different in frequency from the second pass band such that the insertion loss within the overlapping band for the third characteristic is greater than the insertion loss within the overlapping band for the second characteristic.

Accordingly, when the first filter is selected and when the third characteristic of the second filter is selected, the attenuation of the second filter within the overlapping band can be greater than that when the second characteristic is selected. This can achieve a reduction in size and cost while maintaining the bandpass characteristic and attenuation characteristic of the first filter.

Further, the first filter may be a variable filter capable of changing a characteristic to one of the first characteristic and a characteristic different from the first characteristic.

Accordingly, implementing the first filter as a variable filter can achieve a compact multiplexer supporting three or more bands.

Further, the second filter may include a series-arm resonator connected on a path connecting the common terminal and the second input/output terminal to each other, and a parallel-arm circuit connected between ground and a node on the path connecting the common terminal and the second input/output terminal to each other. The parallel-arm circuit may include a parallel-arm resonator connected between the node and the ground, and an impedance element and a switch element that are connected in parallel to each other. A circuit in which the impedance element and the switch element are connected in parallel to each other may be connected in series with the parallel-arm resonator between the node and the ground. The characteristic of the second filter may be changed between the second characteristic and the third characteristic by shifting at least one of a frequency at which impedance of the parallel-arm circuit reaches a local minimum and a frequency at which the impedance reaches a local maximum to a lower range or to a higher range in accordance with connection or disconnection of the switch element.

Accordingly, in the second filter having a ladder configuration, a frequency variable circuit is constituted by a switch element and an impedance element. This can make the second filter compact. In addition, the resonance characteristics of a parallel-arm resonator to which the frequency variable circuit is connected can change the pass band and attenuation pole on the low-frequency side, the high-frequency side, or both sides of the second pass band.

Further, the second filter may include a series-arm resonator connected on a path connecting the common terminal and the second input/output terminal to each other, and a parallel-arm circuit connected between ground and a node on the path connecting the common terminal and the second input/output terminal to each other. The parallel-arm circuit may include a parallel-arm resonator connected between the node and the ground, and a switch element connected in series with the parallel-arm resonator between the node and the ground. The characteristic of the second filter may be changed between the second characteristic and the third characteristic by switching impedance of the parallel-arm circuit in accordance with connection or disconnection of the switch element.

Accordingly, in the second filter having a ladder configuration, a frequency variable circuit is constituted by a switch element. This can make the second filter compact. In addition, the resonance characteristics of a parallel-arm resonator to which the frequency variable circuit is connected can change the pass band and attenuation pole on the low-frequency side, the high-frequency side, or both sides of the second pass band.

Further, the second filter may include a series-arm circuit connected between the common terminal and the second input/output terminal, and a parallel-arm resonator connected between ground and a node on the path connecting the common terminal and the second input/output terminal to each other. The series-arm circuit may include a series-arm resonator connected between the common terminal and the second input/output terminal, and an impedance element and a switch element that are connected in series with each other and that are connected in parallel to the series-arm resonator between the common terminal and the second input/output terminal. The characteristic of the second filter may be changed between the second characteristic and the third characteristic by shifting a frequency at which impedance of the series-arm circuit reaches a local maximum to a lower range or to a higher range in accordance with connection or disconnection of the switch element.

Accordingly, in the second filter having a ladder configuration, a frequency variable circuit is constituted by a switch element and an impedance element. This can make the second filter compact. In addition, the resonance characteristics of a series-arm resonator to which the frequency variable circuit is connected can change the pass band and attenuation pole on the low-frequency side, the high-frequency side, or both sides of the second pass band.

Further, the second filter may further include a longitudinally coupled filter circuit arranged between the common terminal and the second input/output terminal.

Accordingly, a required filter characteristic, such as attenuation enhancement, can be satisfied.

Further, the impedance element may be a variable capacitor or a variable inductor.

Accordingly, the frequency variable width of the second filter can be finely adjusted.

Further, the switch element may be a GaAs or CMOS FET switch or a diode switch.

Accordingly, the switch element can be made compact, and thus the filter device can be made compact.

Further, one of the first filter and the second filter may be any one of a surface acoustic wave filter, a boundary acoustic wave filter, and an elastic wave filter that uses a BAW (Bulk Acoustic Wave).

Accordingly, either the first filter or the second filter can be made compact, and thus the filter device can be made compact. In addition, a surface acoustic wave filter and an elastic wave filter that uses a BAW generally have a high Q characteristic, and thus low loss and high selectivity can be obtained.

Further, one of the first filter and the second filter may be a filter that includes an LC resonator or a dielectric resonator.

Accordingly, either the first filter or the second filter can have a wide pass band.

Further, the switch circuit may be arranged only either between the common terminal and the first and second filters or between the first and second filters and the first and second input/output terminals.

Accordingly, when the second filter is selected by the switch circuit, the second characteristic or the fourth characteristic, which supports two different bands, is selected, and when the first filter is selected by the switch circuit, the third characteristic for which the insertion loss within the overlapping band is greater than that for the second characteristic is selected. Thus, a compact multiplexer supporting three or more bands can be obtained.

Alternatively, the switch circuit may be arranged both between the common terminal and the first and second filters and between the first and second filters and the first and second input/output terminals.

Accordingly, a reduction in size can be achieved with the bandpass characteristic and attenuation characteristic of the first filter maintained.

Further, the second filter may be a filter capable of changing the characteristic to one of the second characteristic, the third characteristic, and a fourth characteristic, and the fourth characteristic may have a fourth pass band that is different in frequency from the second pass band. The characteristic of the second filter may be set to the third characteristic when the common terminal, the first filter, and the first input/output terminal are connected to each other by using the switch circuit, and may be set to the second characteristic or the fourth characteristic when the common terminal, the second filter, and the second input/output terminal are connected to each other by using the switch circuit.

Accordingly, compared with a configuration in which the switch circuit is arranged on only one side, better bandpass characteristics and attenuation characteristics of the first filter and the second filter can be obtained.

Further, the first filter may be a filter capable of changing a characteristic to one of the first characteristic and the fifth characteristic, and the fifth characteristic may have a fifth pass band that is different in frequency from the first pass band. The first pass band may be a reception band of LTE (Long Term Evolution) Band 20+Band 28, the second pass band may be one of a reception band of LTE Band 26 and a reception band of LTE Band 27, the fourth pass band may be another of the reception band of LTE Band 26 and the reception band of LTE Band 27, and the fifth pass band may be a reception band of LTE Band 68.

Accordingly, when the first filter is selected by the switch circuit, the fifth characteristic supporting the reception band of Band 68 or the first characteristic supporting the reception band of Band (20+28) is selected in the first filter. When the first filter is selected by the switch circuit, furthermore, the third characteristic for which the insertion loss within the overlapping band is greater than that for the second characteristic is selected in the second filter. In contrast, when the second filter is selected by the switch circuit, the second characteristic or the fourth characteristic supporting the reception band of Band 26 or the reception band of Band 27 is selected. Thus, a compact multiplexer supporting four or more bands can be obtained.

In addition, a radio-frequency front-end circuit according to an aspect of the present disclosure includes an amplifier circuit connected to the first input/output terminal and the second input/output terminal and configured to amplify a radio-frequency signal, and the filter device described above.

Accordingly, a compact radio-frequency front-end circuit with the bandpass characteristics and attenuation characteristics of filters maintained can be obtained.

Additionally, a communication apparatus according to an aspect of the present disclosure includes an RF signal processing circuit that processes a radio-frequency signal that is transmitted from or received at an antenna element, the filter device described above or the radio-frequency front-end circuit described above, which transmits the radio-frequency signal between the antenna element and the RF signal processing circuit, and a control unit that synchronously controls switching between connection and disconnection of the switch circuit and switching of the characteristic of the second filter between the first characteristic and the second characteristic.

With the configuration described above, when causing the switch circuit to select the first filter, the control unit synchronously causes the switch element to select the third characteristic of the second filter. When the third characteristic is selected, compared with when the second characteristic is selected, the leakage of radio-frequency signals within the overlapping band into the second filter through the switch circuit can be suppressed. Thus, the bandpass characteristic or attenuation characteristic of the first filter within the overlapping band can be prevented from deteriorating due to the effect of leaking signals into the second filter. In addition, the second filter is implemented as a variable filter, which eliminates the need to increase the size of the switch circuit to enhance the isolation more than necessary. Thus, a compact communication apparatus with the bandpass characteristic and attenuation characteristic of the first filter maintained can be obtained.

A filter device, a radio-frequency front-end circuit, and a communication apparatus according to the present disclosure can include a plurality of filters connected to a common terminal, and a switch circuit configured to switch the plurality of filters, and can be made compact while maintaining good filter characteristics.

DETAILED DESCRIPTION OF THE DISCLOSURE

Figure 1A:
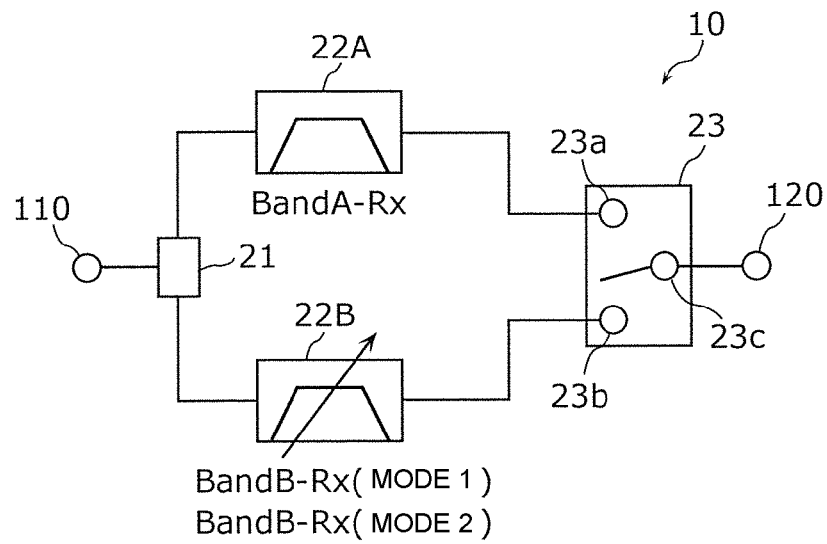
FIG. 1A is a circuit configuration diagram of a filter device according to Embodiment 1.

The following describes embodiments of the present disclosure in detail with reference to the drawings. All of the embodiments described below provide general or specific examples. The values, shapes, materials, constituent elements, the arrangements and connection forms of the constituent elements, and so on, which are provided in the following embodiments, are examples and are not intended to limit the present disclosure. The constituent elements mentioned in the following embodiments are described as optional constituent elements unless they are specified in the independent claims. In addition, the constituent elements illustrated in the drawings are not representative of exact proportions or dimensions.

Embodiment 1

[1.1 Circuit Configuration of Filter Device]

FIG. 1A is a circuit configuration diagram of a filter device 10 according to Embodiment 1. As illustrated in FIG. 1A, the filter device 10 includes a filter 22A, a variable filter 22B, a switch 23, a matching circuit 21, a common terminal 110, and an output terminal 120. The filter device 10 is a composite filter device including the filter 22A and the variable filter 22B, which are connected to the common terminal 110 (via the matching circuit 21).

The common terminal 110 can be connected to, for example, an antenna element, and the output terminal 120 can be connected to a radio-frequency signal processing circuit (RFIC) via a low-noise amplifier circuit (LNA). In this embodiment, the output terminal 120 is a second common terminal that serves as both an output terminal (the first input/output terminal) for a Band-A signal path and an output terminal (the second input/output terminal) for a Band-B signal path.

The matching circuit 21 is a circuit arranged between the common terminal 110 and the filter 22A and between the common terminal 110 and the variable filter 22B. Examples of the matching circuit 21 include a phase shifter, an impedance matching circuit, a switch, and a circulator. The matching circuit 21 integrates the input terminals of the filter 22A and the variable filter 22B.

The matching circuit 21 is optional, and the common terminal 110 may be connected directly to the filter 22A and the variable filter 22B.

The switch 23 is a switch circuit including selection terminals 23a and 23b and a common switch terminal 23c. The selection terminal 23a is connected to one end of the filter 22A, and the selection terminal 23b is connected to one end of the variable filter 22B. With the connection configuration described above, the switch 23 switches between the connection of the common terminal 110, the filter 22A, and the output terminal 120 to each other and the connection of the common terminal 110, the variable filter 22B, and the output terminal 120 to each other.

The switch 23 may be arranged in the preceding stage of the filter 22A and the variable filter 22B (on the common terminal 110 side), rather than in the subsequent stage of the filter 22A and the variable filter 22B (on the output terminal 120 side). In this case, the common terminal 110 and the common switch terminal 23c are connected to each other, the selection terminal 23a is connected to the other end of the filter 22A, and the selection terminal 23b is connected to the other end of the variable filter 22B. Further, the one end of the filter 22A serves as an output terminal (the first input/output terminal) for the Band-A signal path, and the one end of the variable filter 22B serves as an output terminal (the second input/output terminal) for the Band-B signal path.

The filter 22A is a first filter arranged between the common terminal 110 and the selection terminal 23a. The variable filter 22B is a second filter arranged between the common terminal 110 and the selection terminal 23b.

Figure 1B:
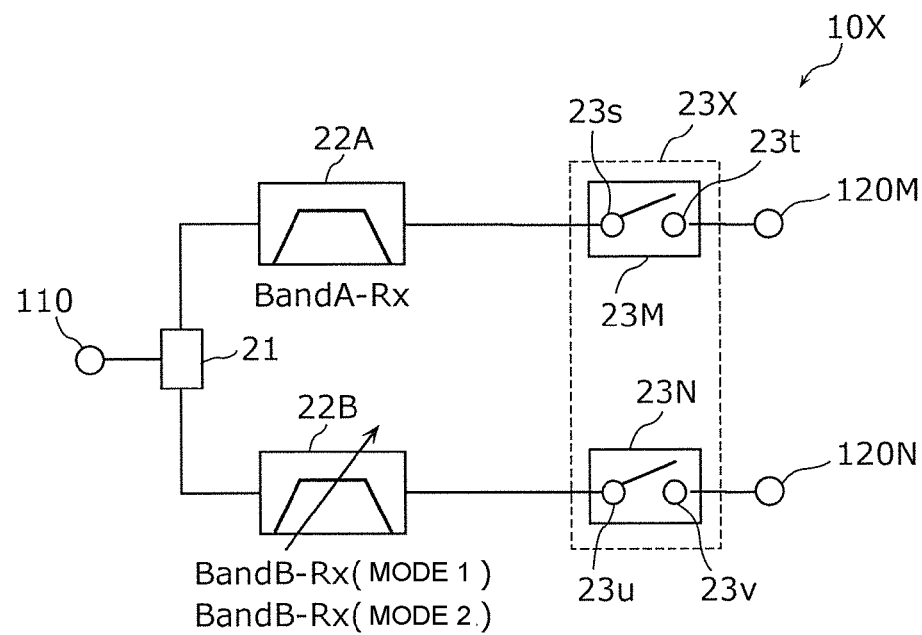
FIG. 1B is a circuit configuration diagram of a filter device according to Modification 1 of Embodiment 1.
Figure 1C:
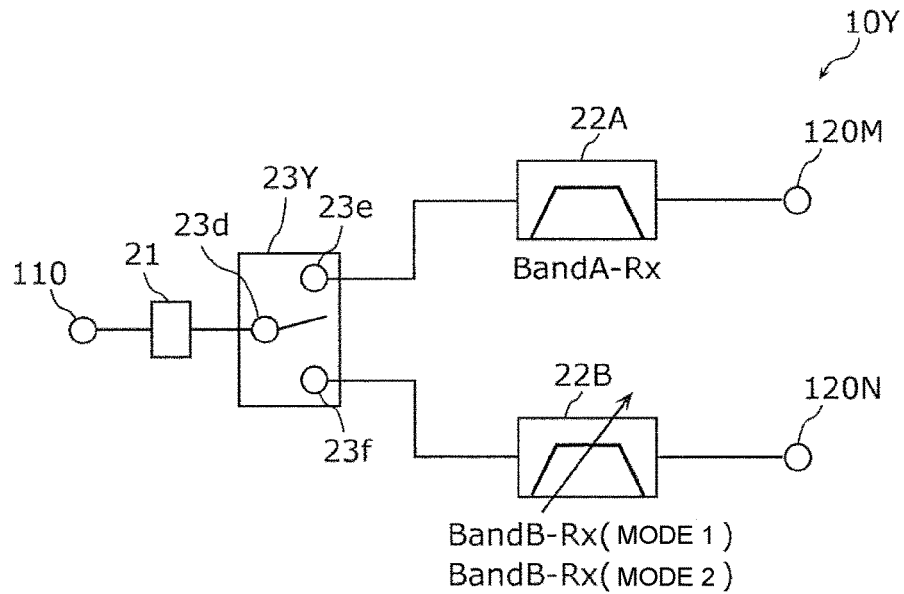
FIG. 1C is a circuit configuration diagram of a filter device according to Modification 2 of Embodiment 1.

Instead of the configuration of the filter device 10 according to Embodiment 1 illustrated in FIG. 1A, the filter device according to the present disclosure may have any of configurations illustrated in FIG. 1B and FIG. 1C.

FIG. 1B is a circuit configuration diagram of a filter device 10X according to Modification 1 of Embodiment 1. As illustrated in FIG. 1B, the filter device 10X includes a filter 22A, a variable filter 22B, a switch circuit 23X, a matching circuit 21, a common terminal 110, and output terminals 120M and 120N. The filter device 10X is a composite filter device including the filter 22A and the variable filter 22B, which are connected to the common terminal 110 (via the matching circuit 21). The filter device 10X according to this modification is different from the filter device 10 according to Embodiment 1 in the configuration of the switch circuit and the number of output terminals. The following describes the filter device 10X according to this modification, focusing on the differences in configuration from the filter device 10 according to Embodiment 1, with the description of the same configuration omitted.

The switch circuit 23X includes SPST (Single Pole Single Throw) switches 23M and 23N. The switch 23M has a terminal 23s connected to one end of the filter 22A, and a terminal 23t connected to the output terminal 120M (the first input/output terminal). The switch 23N has a terminal 23u connected to one end of the variable filter 22B, and a terminal 23v connected to the output terminal 120N (the second input/output terminal). With the connection configuration described above, the switches 23M and 23N are exclusively switched to switch between the connection of the common terminal 110, the filter 22A, and the output terminal 120M to each other and the connection of the common terminal 110, the variable filter 22B, and the output terminal 120N to each other.

FIG. 1C is a circuit configuration diagram of a filter device 10Y according to Modification 2 of Embodiment 1. As illustrated in FIG. 1C, the filter device 10Y includes a filter 22A, a variable filter 22B, a switch 23Y, a matching circuit 21, a common terminal 110, and output terminals 120M and 120N. The filter device 10Y is a composite filter device including the filter 22A and the variable filter 22B, which are connected to the common terminal 110 (via the matching circuit 21 and the switch 23Y). The filter device 10Y according to this modification is different from the filter device 10 according to Embodiment 1 in the arrangement position of the switch circuit. The following describes the filter device 10Y according to this modification, focusing on the differences in configuration from the filter device 10 according to Embodiment 1, with the description of the same configuration omitted.

The switch 23Y is a switch circuit including selection terminals 23e and 23f and a common switch terminal 23d. One end of the filter 22A is connected to the output terminal 120M (first input/output terminal), and the other end of the filter 22A is connected to the selection terminal 23e. One end of the variable filter 22B is connected to the output terminal 120N (second input/output terminal), and the other end of the variable filter 22B is connected to the selection terminal 23f. The common switch terminal 23d is connected to the common terminal 110 via the matching circuit 21. With the connection configuration described above, the switch 23Y switches between the connection of the common terminal 110, the filter 22A, and the output terminal 120M to each other and the connection of the common terminal 110, the variable filter 22B, and the output terminal 120N to each other.

Figure 1D:
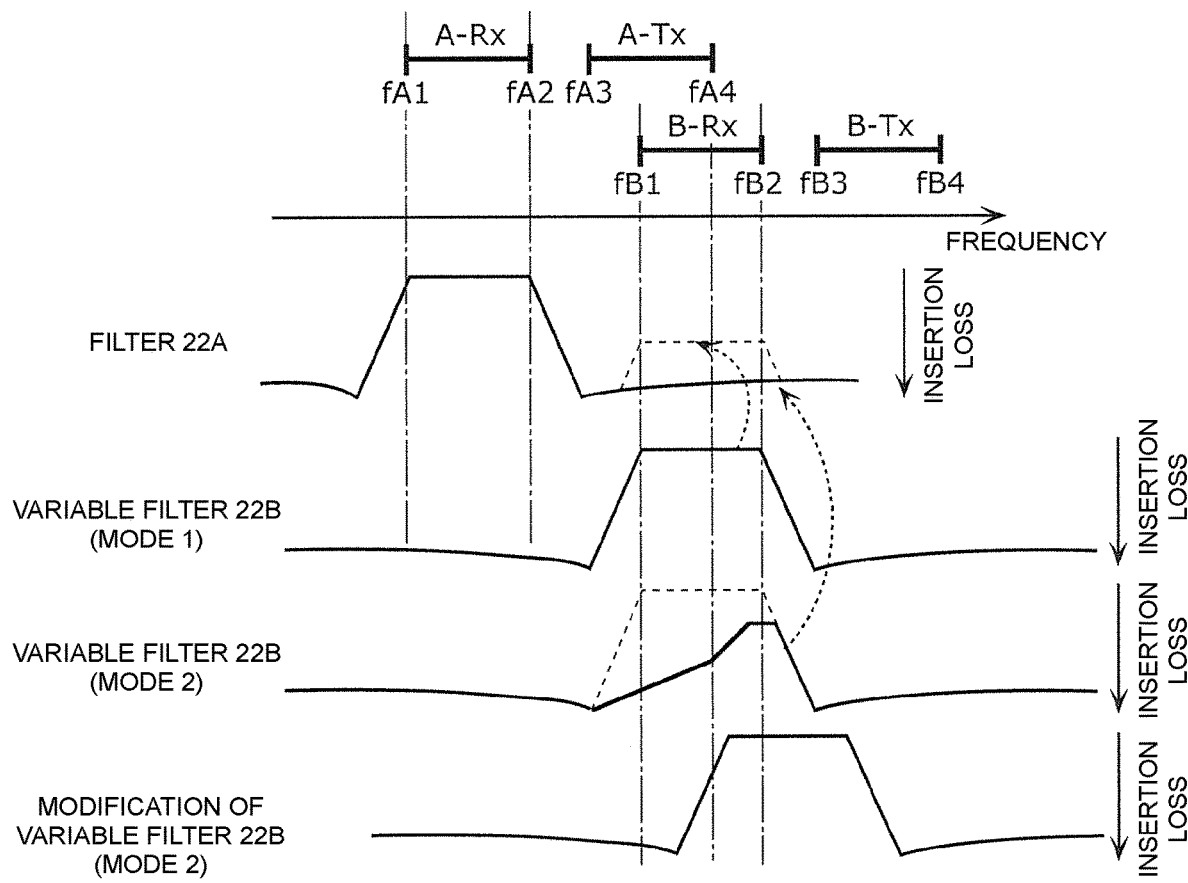
FIG. 1D is a diagram illustrating common-terminal-to-output-terminal bandpass characteristics of a filter and a variable filter according to Embodiment 1.

FIG. 1D is a diagram illustrating common-terminal-to-output-terminal bandpass characteristics of the filter 22A and the variable filter 22B according to Embodiment 1. In FIG. 1D, an upper portion depicts a frequency relationship of the transmission and reception bands of Band A and Band B, and a lower portion depicts the bandpass characteristics of the filter 22A and the variable filter 22B. More specifically, the bandpass characteristic of the filter 22A depicted in the lower portion is a bandpass characteristic obtained when the filter 22A is selected by the switch 23. The bandpass characteristic of the variable filter 22B (mode 1) depicted in the lower portion is a bandpass characteristic obtained when the variable filter 22B is selected by the switch 23. The bandpass characteristic of the variable filter 22B (mode 2) depicted in the lower portion is a bandpass characteristic obtained when the filter 22A is selected by the switch 23. The bandpass characteristic of a modification of the variable filter 22B (mode 2) depicted in the lower portion is a bandpass characteristic obtained when the filter 22A is selected by the switch 23.

As illustrated in FIG. 1D, the filter 22A has a first characteristic having a first pass band set to the reception band of Band A (A-Rx: fA1 to fA2) and a predetermined attenuation band set to the transmission band of Band A (A-Tx: fA3 to fA4).

The variable filter 22B is capable of changing the characteristic to a second characteristic (mode 1) or a third characteristic (mode 2). The second characteristic (mode 1) has a bandpass characteristic having a second pass band set to the reception band of Band B (B-Rx: fB1 to fB2) and a predetermined attenuation band set to the transmission band of Band B (B-Tx: fB3 to fB4). The transmission band of Band A (A-Tx) and the reception band of Band B (B-Rx) overlap in an overlapping band (fB1 to fA4). In contrast, the third characteristic (mode 2) has a bandpass characteristic for which the insertion loss within the overlapping band is greater than the insertion loss within the overlapping band for the second characteristic (mode 1).

Examples of the form in which the insertion loss within the overlapping band for the third characteristic (mode 2) is greater than the insertion loss within the overlapping band for the second characteristic (mode 1) include (1) the variable filter 22B (mode 2), and (2) the modification of the variable filter 22B (mode 2) in FIG. 1D.

In (1) the variable filter 22B (mode 2) in FIG. 1D, the insertion loss within the overlapping band is made greater without shifting the pass band, whereas in (2) the modification of the variable filter 22B (mode 2), the insertion loss within the overlapping band is made greater by shifting the pass band to a higher frequency range.

[1.2 Filter Selection and Mode Selection in Filter Device]

Figure 2:
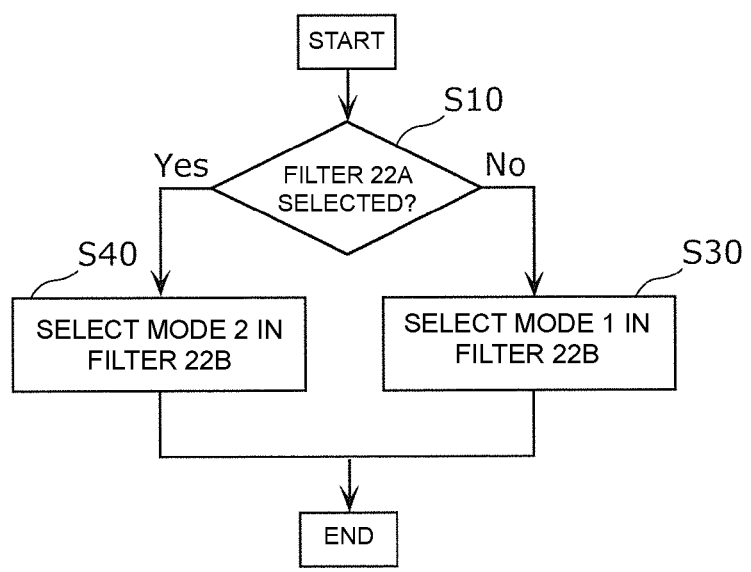
FIG. 2 is a flowchart illustrating a relationship between filter selection and mode selection according to Embodiment 1.

FIG. 2 is a flowchart illustrating a relationship between filter selection and mode selection according to Embodiment 1. When the selection terminal 23a and the common switch terminal 23c of the switch 23 are connected together, that is, when the filter 22A is selected (Yes in S10), the third characteristic (mode 2) is selected in the variable filter 22B (S20). When the selection terminal 23b and the common switch terminal 23c of the switch 23 are connected together, that is, when the variable filter 22B is selected (No in S10), the second characteristic (mode 1) is selected in the variable filter 22B (S30). As in (2) the modification of the variable filter 22B (mode 2) in FIG. 1D, when the frequencies of the pass band are varied in the mode 2, the third characteristic (mode 2) may be selected in the variable filter 22B if the variable filter 22B is selected (No in S10). In this case, even if the third characteristic (mode 2) is selected in the variable filter 22B, the third characteristic is a filter characteristic having a pass band of, for example, Band C, which is different from Bands A and B. That is, when the third characteristic (mode 2) is selected in the variable filter 22B, the variable filter 22B exhibits a filter characteristic supporting Band C.

With the configuration described above, when the filter 22A is selected by the switch 23, the third characteristic (mode 2) is selected in the variable filter 22B although the variable filter 22B is not selected. When the third characteristic (mode 2) is selected, the leakage of radio-frequency signals within the overlapping band into the variable filter 22B due to the isolation of the switch 23 can be suppressed, compared with when the second characteristic (mode 1) is selected. Thus, the attenuation characteristic of the filter 22A within the overlapping band can be prevented from deteriorating due to the effect of leaking signals into the variable filter 22B. That is, the insertion loss within the overlapping band for the third characteristic (mode 2) is greater than the insertion loss within the overlapping band for the second characteristic (mode 1) so that the third characteristic (mode 2) of the variable filter 22B does not deteriorate the filter characteristic of the filter 22A when the filter 22A is selected by the switch 23, compared with the filter characteristic of the filter 22A alone.

In addition, the variable filter 22B is a filter capable of changing the mode to any one of two modes. Thus, no need exists to increase the size of the switch circuit to enhance the isolation more than necessary. This can achieve a reduction in the size of the filter device 10 while maintaining the attenuation characteristic of the filter 22A.

In the filter configuration described above, if the first pass band (A-Rx) of the filter 22A and the second pass band (B-Rx) of the variable filter 22B partially overlap, this overlap may be used as an overlapping band. In this case, the bandpass characteristic of the filter 22A within the overlap-
ping band can be prevented from deteriorating due to the effect of leaking signals into the variable filter 22B.

In the filter configuration described above, furthermore, if the second pass band (B-Rx) of the variable filter 22B is located over the first pass band (A-Rx) and the attenuation band (A-Tx) of the filter 22A, this overlap may be used as an overlapping band. In this case, the bandpass characteristic and attenuation characteristic of the filter 22A within the overlapping band can be prevented from deteriorating due to the effect of leaking signals into the variable filter 22B.

Moreover, as in the filter characteristic of the modification of the variable filter 22B (mode 2) depicted in the lower portion of FIG. 1D, the frequencies of the pass band for the third characteristic (mode 2) may be different from those of the second pass band (B-Rx) as a form in which the insertion loss within the overlapping band for the third characteristic (mode 2) of the variable filter 22B is greater than the insertion loss within the overlapping band for the second characteristic (mode 1).

As another form in which the bandpass characteristic within the overlapping band for the third characteristic (mode 2) of the variable filter 22B is greater than the insertion loss within the overlapping band for the second characteristic (mode 1), the insertion loss within the overlapping band for the third characteristic (mode 2) may be greater than the insertion loss within the overlapping band for the second characteristic (mode 1).

With these forms of the third characteristic (mode 2), when the filter 22A is selected and when the third characteristic (mode 2) of the variable filter 22B is selected, the insertion loss of the variable filter 22B within the overlapping band can be greater than that when the second characteristic (mode 1) is selected. This can achieve a reduction in the size of the filter device 10 while maintaining the attenuation characteristic of the filter 22A.

Embodiment 2

This embodiment illustrates a configuration in which the filter device according to Embodiment 1 is applied to a multi-band communication apparatus supporting the LTE (Long Term Evolution) communication standard.

[2.1 Circuit Configuration of Communication Apparatus]

Figure 3:
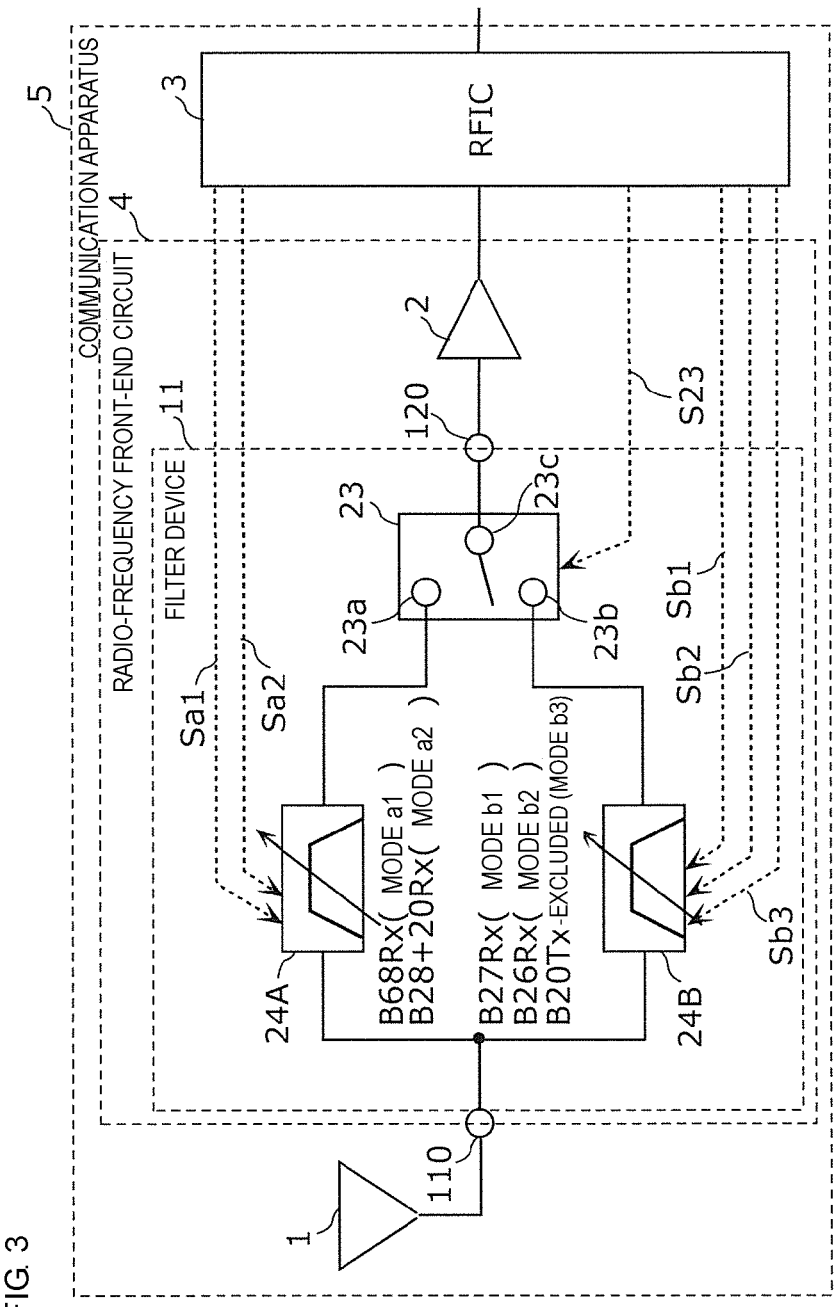
FIG. 3 is a circuit configuration diagram of a filter device, a radio-frequency front-end circuit, and a communication apparatus according to Embodiment 2.

FIG. 3 is a circuit configuration diagram of a filter device 11, a radio-frequency front-end circuit 4, and a communication apparatus 5 according to Embodiment 2. In FIG. 3, the filter device 11, a reception amplifier circuit 2, and an RF signal processing circuit (RFIC) 3 are illustrated. The filter device 11 and the reception amplifier circuit 2 constitute the radio-frequency front-end circuit 4. Further, an antenna element 1, the radio-frequency front-end circuit 4, and the RF signal processing circuit (RFIC) 3 constitute the communication apparatus 5. The antenna element 1, the radio-frequency front-end circuit 4, and the RF signal processing circuit (RFIC) 3 are arranged in, for example, a front-end portion of a multi-mode/multi-band cellular phone.

The RF signal processing circuit (RFIC) 3 performs signal processing on a radio-frequency reception signal inputted from the antenna element 1 via a reception-side signal path by using down-conversion or the like, and outputs a reception signal, which is generated as a result of the signal processing, to a baseband signal processing circuit (not illustrated). Although not illustrated in FIG. 3, the RF signal processing circuit (RFIC) 3 is capable of performing signal processing on a transmission signal inputted from the baseband signal processing circuit by using up-conversion or the like, and outputting a radio-frequency transmission signal, which is generated as a result of the signal processing, to a transmission amplifier circuit.

The RF signal processing circuit (RFIC) 3 functions as a control unit that synchronously controls, based on the frequency band to be used, the switching of the connection and disconnection of a switch 23 included in the filter device 11 and the mode switching of variable filters 24A and 24B included in the filter device 11. The control unit may not necessarily be included in the RF signal processing circuit (RFIC) 3, and may be included in the radio-frequency front-end circuit 4 as a control IC, for example.

The reception amplifier circuit 2 amplifies a radio-frequency reception signal, which is outputted from an output terminal 120 of the filter device 11, and outputs the amplified radio-frequency reception signal to the RF signal processing circuit (RFIC) 3.

[2.2 Circuit Configuration of Filter Device]

The filter device 11 includes the variable filters 24A and 24B, the switch 23, a common terminal 110, and the output terminal 120. With this configuration, the filter device 11 receives radio-frequency signals of Band 68, Band (28+20), Band 27, and Band 26 via the antenna element 1.

The filter device 11 according to this embodiment is an example in which the filter device 10 according to Embodiment 1 supports the LTE communication standard. In the filter device 10, the filter 22A is a fixed filter supporting a single band, whereas, in the filter device 11, the variable filters 24A and 24B are each a variable filter supporting a plurality of bands.

The switch 23 is a Single Pole Double Throw (SPDT) switch circuit having selection terminals 23a and 23b and a common switch terminal 23c and configured to exclusively switch, in accordance with a control signal S23 from the RF signal processing circuit (RFIC) 3, between the connection of the common switch terminal 23c and the selection terminal 23a to each other and the connection of the common switch terminal 23c and the selection terminal 23b to each other. The selection terminal 23a is connected to an output end of the variable filter 24A, and the selection terminal 23b is connected to an output end of the variable filter 24B. With the connection configuration described above, the switch 23 switches between the connection of the common terminal 110, the variable filter 24A, and the output terminal 120 to each other and the connection of the common terminal 110, the variable filter 24B, and the output terminal 120 to each other.

The switch 23 may be arranged in the preceding stage of the variable filter 24A and the variable filter 24B, rather than in the subsequent stage of the variable filter 24A and the variable filter 24B.

The variable filter 24A is a first filter arranged between the common terminal 110 and the selection terminal 23a. The variable filter 24B is a second filter arranged between the common terminal 110 and the selection terminal 23b.

Figure 4:
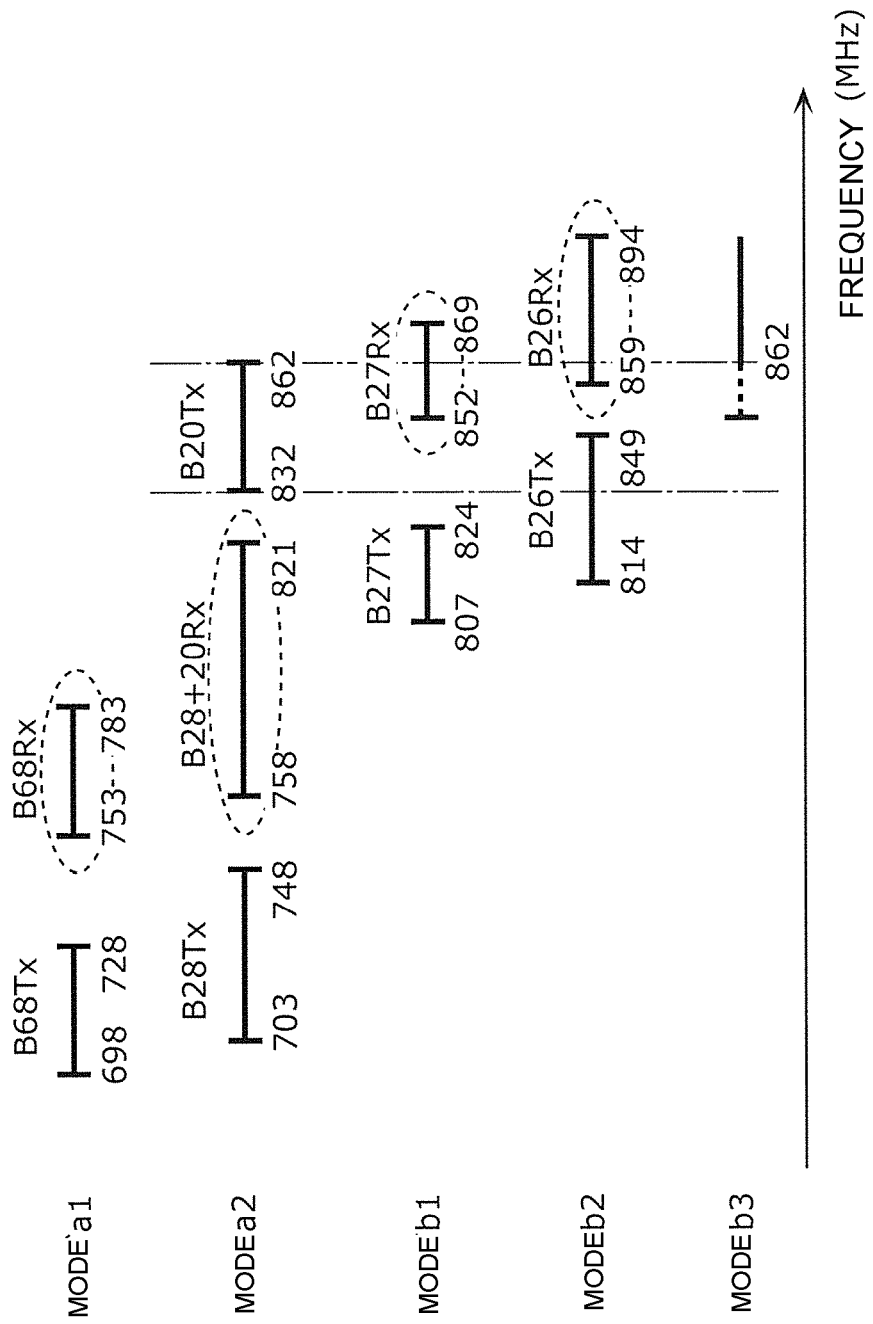
FIG. 4 is a diagram illustrating a relationship between modes and allocated frequencies for variable filters according to Embodiment 2.

FIG. 4 is a diagram illustrating a relationship between modes and allocated frequencies for the variable filters 24A and 24B according to Embodiment 2. In FIG. 4, the frequency allocation for Band 68, Band (28+20), Band 27, and Band 26 is illustrated.

The variable filter 24A is a filter capable of changing the characteristic to a first characteristic (mode a2) or a fifth characteristic (mode a1).

The first characteristic (mode a2) is a characteristic having a first pass band set to the reception band of Band (20+28) (B28+20Rx: 758-821 MHz) and an attenuation band set to the transmission band of Band 28 (B28Tx: 703-748 MHz) and the transmission band of Band 20 (B20Tx: 832-862 MHz).

The fifth characteristic (mode a1) is a characteristic having a fifth pass band set to the reception band of Band 68 (B68Rx: 753-783 MHz) and an attenuation band set to the transmission band of Band 68 (B68Tx: 698-728 MHz). As illustrated in FIG. 4, furthermore, the frequencies of the fifth pass band (B68Rx: 753-783 MHz) of the fifth characteristic (mode a1) are different from those of the first pass band (B28+20Rx: 758-821 MHz) of the first characteristic (mode a2). In this embodiment, the fifth pass band (B68Rx: 753-783 MHz) of the fifth characteristic (mode a1) and the first pass band (B28+20Rx: 758-821 MHz) of the first characteristic (mode a2) partially overlap (758-783 MHz). Note that Band 68 and Band (28+20) are not used simultaneously but are used exclusively. Thus, the variable filter 24A is a tunable filter capable of changing the pass band to the reception band of Band 68 or the reception band of Band (20+28).

The variable filter 24B is a filter capable of changing the characteristic to a second characteristic (mode b1), a fourth characteristic (mode b2), or a third characteristic (mode b3).

The second characteristic (mode b1) is a characteristic having a second pass band set to the reception band of Band 27 (B27Rx: 852-869 MHz) and an attenuation band set to the transmission band of Band 27 (B27Tx: 807-824 MHz).

The fourth characteristic (mode b2) is a characteristic having a fourth pass band set to the reception band of Band 26 (B26Rx: 859-894 MHz) and an attenuation band set to the transmission band of Band 26 (B26Tx: 814-849 MHz). The variable filter 24B is capable of changing the characteristic to the second characteristic (mode b1), the fourth characteristic (mode b2), or the third characteristic (mode b3). As illustrated in FIG. 4, furthermore, the frequencies of the second pass band (B27Rx: 852-869 MHz) of the second characteristic (mode b1) are different from those of the fourth pass band (B26Rx: 859-894 MHz) of the fourth characteristic (mode b2). In this embodiment, the second pass band (B27Rx: 852-869 MHz) of the second characteristic (mode b1) and the fourth pass band (B26Rx: 859-894 MHz) of the fourth characteristic (mode b2) partially overlap (859-869 MHz). Note that Band 26 and Band 27 are not used simultaneously but are used exclusively. Thus, the variable filter 24B is a tunable filter capable of changing the pass band to the reception band of Band 27 or the reception band of Band 26.

The transmission band of Band 20 (B20Tx) overlaps with the reception band of Band 27 (B27Rx) and the reception band of Band 26 (B26Rx) in an overlapping band (852-862 MHz).

The third characteristic (mode b3) has a bandpass characteristic for which the insertion loss within the overlapping band (852-862 MHz) is greater than the insertion loss within the overlapping band for the second characteristic (mode b1). In other words, the third characteristic (mode b3) is a characteristic in which the pass band excludes the overlapping band (852-862 MHz).

[2.3 Effect of Switch Isolation]

A description will now be given of a relationship between the filter characteristic of the variable filter 24A and the isolation of the switch 23 in the filter device 11.

Figure 5:
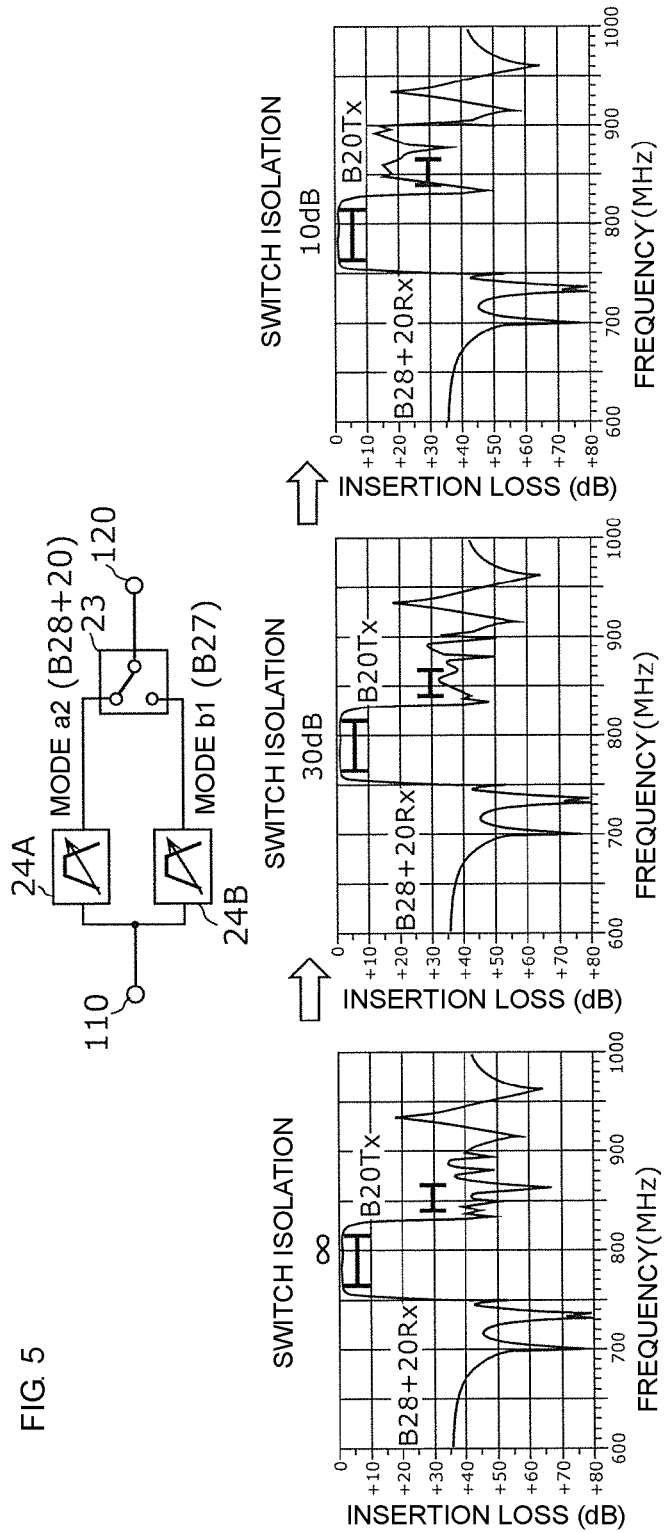
FIG. 5 is a graph illustrating filter bandpass characteristics corresponding to the isolation of a switch circuit.

FIG. 5 is a graph illustrating filter bandpass characteristics corresponding to the isolation of the switch 23. In FIG. 5, the bandpass characteristics of the variable filter 24A when the variable filter 24A is selected by the switch 23 in the filter device 11 are illustrated. In this case, the variable filter 24A is in the mode a2, and the variable filter 24B is in the mode b1.

As illustrated in FIG. 5, it is understood that as the isolation of the switch 23 deteriorates from ∞ to 10 dB, the attenuation characteristic for the transmission band of Band 20 (B20Tx) deteriorates. In particular, when the isolation of the switch 23 becomes less than or equal to 30 dB, the attenuation characteristic for the transmission band (B20Tx) markedly deteriorates. This is because, as the isolation of the switch 23 deteriorates, the filter characteristic of the variable filter 24B affects the filter characteristic of the variable filter 24A through the switch 23. That is, when the mode b1 of the variable filter 24B is selected, the variable filter 24B has a filter characteristic having a second pass band set to the reception band of Band 27 (B27Rx: 852-869 MHz). Accordingly, the bandpass characteristic of the variable filter 24B within the overlapping band (852-862 MHz) affects the attenuation band (B20Tx) of the variable filter 24A through the switch 23.

With the analysis described above, when the variable filter 24A is selected, the third characteristic (mode b3) of the variable filter 24B can be selected to suppress the deterioration of the attenuation characteristic of the variable filter 24A. The following describes the circuit configurations and filter characteristics of the variable filters 24A and 24B in detail.

[2.4 Circuit Configurations of Variable Filters 24A and 24B]

Figure 6A:
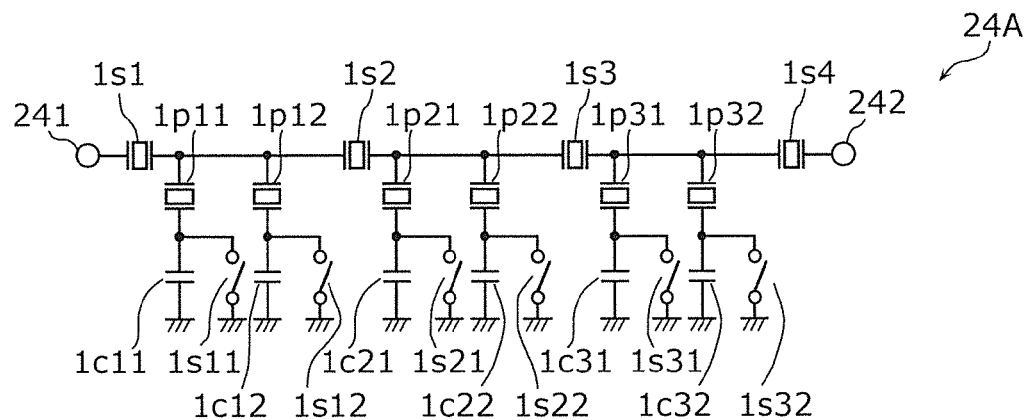
FIG. 6A is a circuit configuration diagram of one variable filter according to Embodiment 2.
Figure 6B:
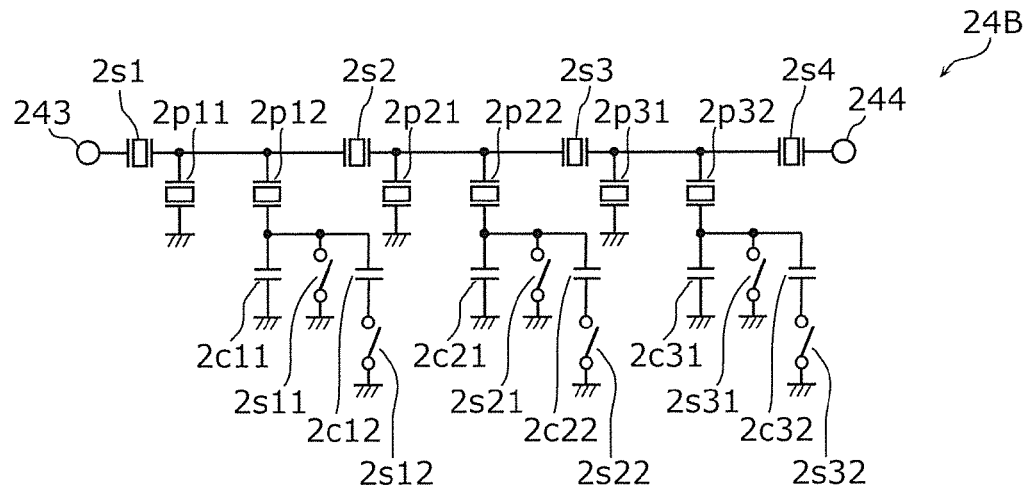
FIG. 6B is a circuit configuration diagram of another variable filter according to Embodiment 2.

FIG. 6A is a circuit configuration diagram of the variable filter 24A according to Embodiment 2. FIG. 6B is a circuit configuration diagram of the variable filter 24B according to Embodiment 2.

As illustrated in FIG. 6A, the variable filter 24A includes series-arm resonators $1s1$, $1s2$, $1s3$, and $1s4$, parallel-arm resonators $1p11$, $1p12$, $1p21$, $1p22$, $1p31$, and $1p32$, capacitors $1c11$, $1c12$, $1c21$, $1c22$, $1c31$, and $1c32$, and switches $1s11$, $1s12$, $1s21$, $1s22$, $1s31$, and $1s32$.

The series-arm resonators $1s1$ to $1s4$ are connected in series between an input end 241 connected to the common terminal 110 and an output end 242 connected to the selection terminal 23a.

The parallel-arm resonators $1p11$ and $1p12$ are connected in parallel to each other and connected to nodes connecting the series-arm resonators $1s1$ and $1s2$ to each other. Further, the capacitor $1c11$ and the switch $1s11$ are connected in parallel to each other and connected to the parallel-arm resonator $1p11$. Further, the capacitor $1c12$ and the switch $1s12$ are connected in parallel to each other and connected to the parallel-arm resonator $1p12$. Subsequently, the parallel-arm resonators $1p21$ to $1p32$, the capacitors $1c21$ to $1c32$, and the switches $1s21$ to $1s32$ are also connected in the manner illustrated in FIG. 6A. The capacitors $1c11$ to $1c32$ are desirably impedance elements each capable of adjusting the impedance of a parallel-arm resonator, and may be inductors, for example.

With the configuration described above, the variable filter 24A constitutes a ladder band pass filter. In the variable filter 24A, furthermore, all of the switches $1s11$ to $1s32$ are switched to on or off, thereby enabling the pass band to shift between the fifth pass band (B68Rx: 753-783 MHz) and the first pass band (B28+20Rx: 758-821 MHz). That is, the fifth characteristic (mode a1) and the first characteristic (mode a2) are switched.

Figure 7A:
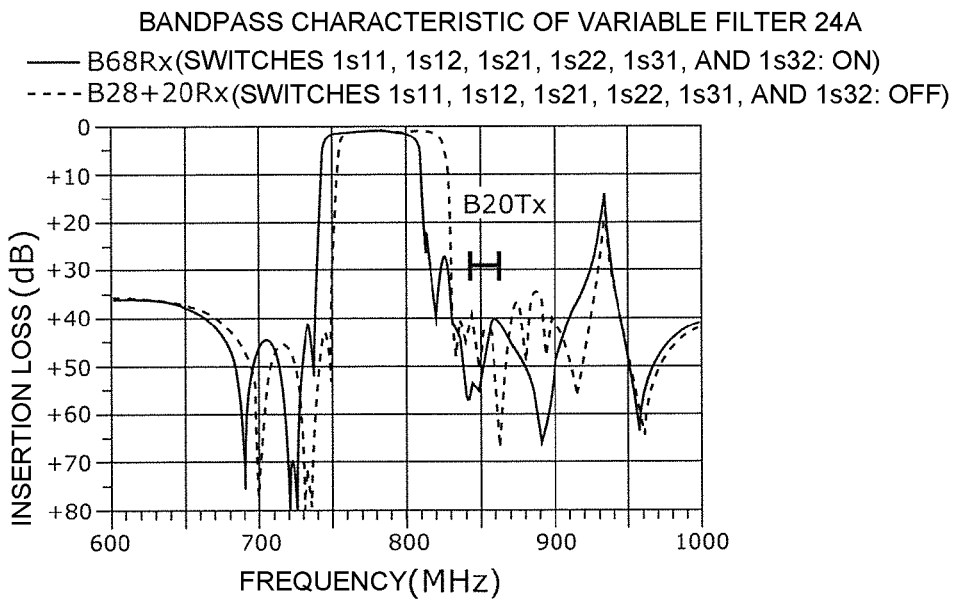
FIG. 7A is a graph illustrating bandpass characteristics of the one variable filter according to Embodiment 2.

FIG. 7A is a graph illustrating bandpass characteristics of the variable filter 24A according to Embodiment 2. As illustrated in FIG. 7A, all of the switches $1s11$ to $1s32$ are turned on to set the characteristic of the variable filter 24A to the fifth characteristic in which the pass band is set to the fifth pass band (B68Rx: 753-783 MHz). Further, all of the switches $1s11$ to $1s32$ are turned off to set the characteristic of the variable filter 24A to the first characteristic in which the pass band is set to the first pass band (B28+20Rx: 758-821 MHz).

As illustrated in FIG. 6B, the variable filter 24B includes series-arm resonators $2s1$, $2s2$, $2s3$, and $2s4$, parallel-arm resonators $2p11$, $2p12$, $2p21$, $2p22$, $2p31$, and $2p32$, capacitors $2c11$, $2c12$, $2c21$, $2c22$, $2c31$, and $2c32$, and switches $2s11$, $2s12$, $2s21$, $2s22$, $2s31$, and $2s32$.

The series-arm resonators $2s1$ to $2s4$ are connected in series between an input end 243 connected to the common terminal 110 and an output end 244 connected to the selection terminal 23b.

The parallel-arm resonators $2p11$ and $2p12$ are connected in parallel to each other and connected to nodes connecting the series-arm resonator $2s1$ and $2s2$ to each other. Further, the capacitor $2c11$, the switch $2s11$, and a series-connected circuit of the capacitor $2c12$ and the switch $2s12$ are connected in parallel to each other and connected to the parallel-arm resonator $2p12$. Subsequently, the parallel-arm resonators $2p21$ to $2p32$, the capacitors $2c21$ to $2c32$, and the switches $2s21$ to $2s32$ are also connected in the manner illustrated in FIG. 6B. The capacitors $2c11$ to $2c32$ are desirably impedance elements each capable of adjusting the impedance of a parallel-arm resonator, and may be inductors, for example.

With the circuit configuration described above, the variable filter 24B constitutes a ladder band pass filter. In the variable filter 24B, furthermore, (1) all of the switches $2s11$ to $2s32$ are switched to on, (2) the switches $2s11$, $2s21$, and $2s31$ are switched to on and the switches $2s12$, $2s22$, and $2s32$ are switched to off, or (3) all of the switches $2s11$ to $2s32$ are switched to off, thereby enabling the pass band to shift among the second pass band (B27Rx: 852-869 MHz), the fourth pass band (B26Rx: 859-894 MHz), and a band excluding B20Tx is excluded. That is, the second characteristic (mode b1), the fourth characteristic (mode b2), and the third characteristic (mode b3) are switched.

Figure 7B:
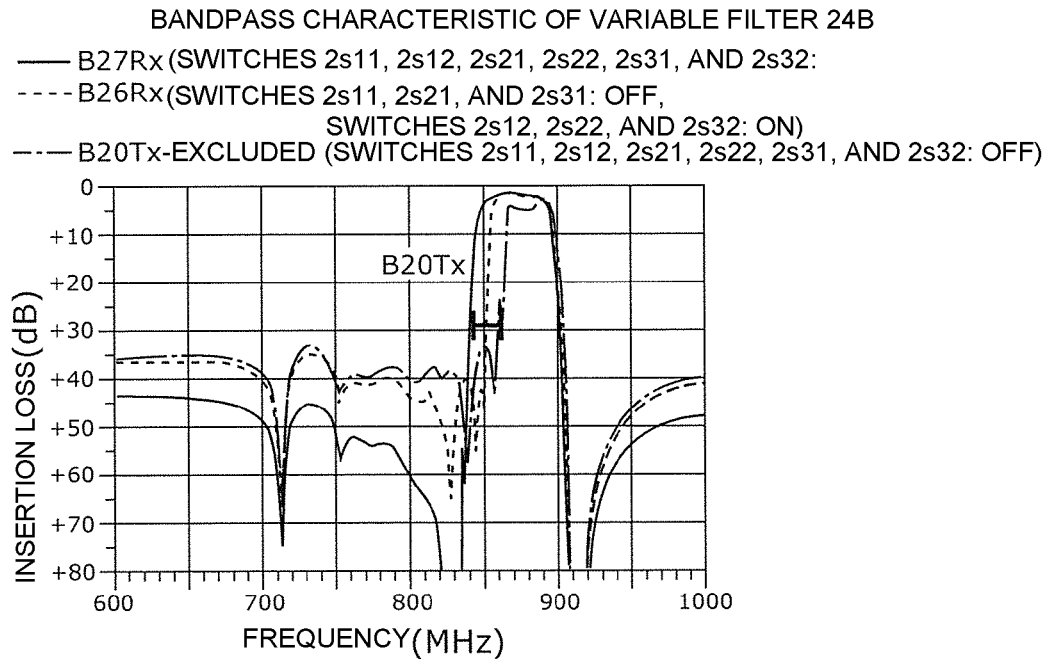
FIG. 7B is a graph illustrating bandpass characteristics of the other variable filter according to Embodiment 2.

FIG. 7B is a graph illustrating bandpass characteristics of the variable filter 24B according to Embodiment 2. As illustrated in FIG. 7B, all of the switches $2s11$ to $2s32$ are turned on to set the characteristic of the variable filter 24B to the second characteristic in which the pass band is set to the second pass band (B27Rx: 852-869 MHz). Further, the switches $2s11$, $2s21$, and $2s31$ are turned on and the switches $2s12$, $2s22$, and $2s32$ are turned off to set the characteristic of the variable filter 24B to the fourth characteristic in which the pass band is set to the fourth pass band (B26Rx: 859-894 MHz). Further, all of the switches $2s11$ to $2s32$ are turned off to set the characteristic of the variable filter 24B to the third characteristic for which the insertion loss within the transmission band of Band 20 (B20Tx) is greater than that for the second characteristic.

[2.5 Variable Filter Selection and Mode Selection]

Figure 8A:
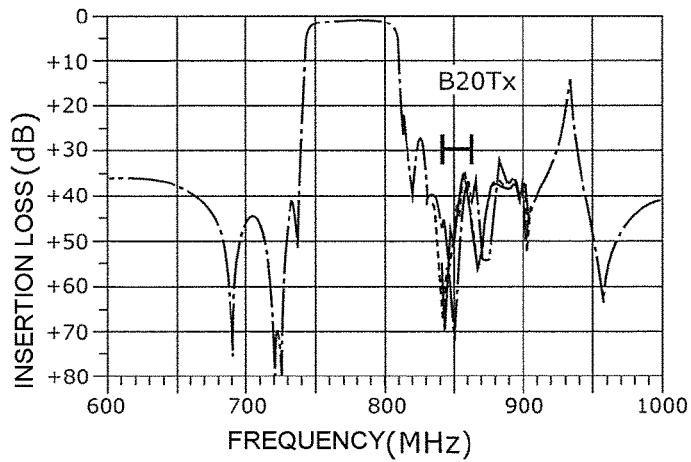
FIG. 8A is a graph illustrating bandpass characteristics of the one variable filter according to Embodiment 2 when mode a1 is selected.

FIG. 8A is a graph illustrating bandpass characteristics of the variable filter 24A according to Embodiment 2 when the mode a1 is selected. In FIG. 8A, bandpass characteristics when the fifth characteristic (mode a1) in which the pass band is set to the fifth pass band (B68Rx: 753-783 MHz) is selected are illustrated. In FIG. 8A, the variable filter 24A is selected by the switch 23. Further, the fifth characteristic (mode a1) is selected using the switches $1s11$ to $1s32$. The reception band of Band 68 (B68Rx) is a reception-only band that does not require a large amount of attenuation near the pass band. Thus, any mode may be selected for the variable filter 24B, which is not selected by the switch 23, or none of the modes may be selected.

Figure 8B:
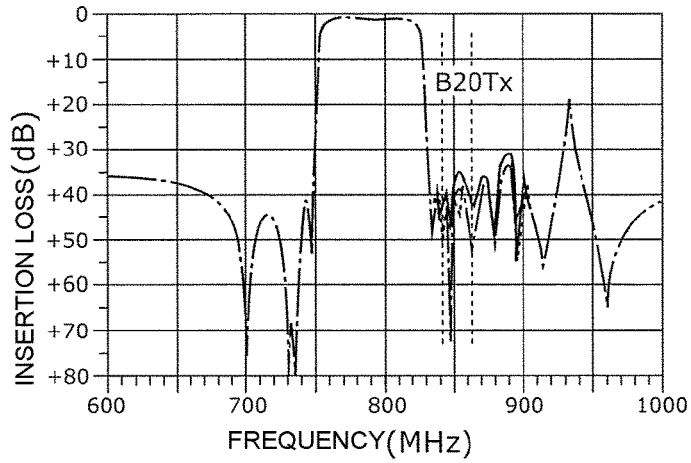
FIG. 8B is a graph illustrating bandpass characteristics of the one variable filter according to Embodiment 2 when mode a2 is selected.

FIG. 8B is a graph illustrating bandpass characteristics of the variable filter 24A according to Embodiment 2 when the mode a2 is selected. In FIG. 8B, bandpass characteristics when the first characteristic (mode a2) in which the pass band is set to the first pass band (B28+20Rx: 758-821 MHz) is selected are illustrated. In FIG. 8B, the variable filter 24A is selected by the switch 23. In a filter characteristic for the reception band (B28+20Rx) of Band (28+20), a predetermined amount of attenuation is required within the transmission band of Band 28 (B28Tx) on the low-frequency side of the pass band and in the transmission band of Band 20 (B20Tx) on the high-frequency side of the pass band, and an attenuation characteristic of about 40 dB is typically required for these transmission bands.

If the attenuation characteristic of the variable filter 24A for the transmission band of Band 20 (B20Tx) is changed by the variable filter 24B, which is not selected by the switch 23, and the mode b1 and mode b2 of the variable filter 24B are selected, a necessary amount of attenuation is not obtained. This is because, in the modes b1 and b2, the insertion loss is not deteriorated in an overlapping band of the transmission band of Band 20 (B20Tx) with the reception band of Band 27 (B27Rx) and the reception band of Band 26 (B26Rx). In the variable filter 24B, which is not selected by the switch 23, therefore, as illustrated in FIG. 7B, the mode b3 needs to be selected, in which the insertion loss within the overlapping band is greater than that in the mode b1 and the mode b2.

With the configuration described above, when the variable filter 24A is selected by the switch 23 and when the first characteristic (mode a2) in which the pass band is set to the first pass band (B28+20Rx: 758-821 MHz) is selected, in the variable filter 24B, which is not selected by the switch 23, the third characteristic for which the insertion loss within the overlapping band is greater than that for the second characteristic is selected. Thus, a compact multiplexer supporting four or more bands can be obtained.

Figure 9A:
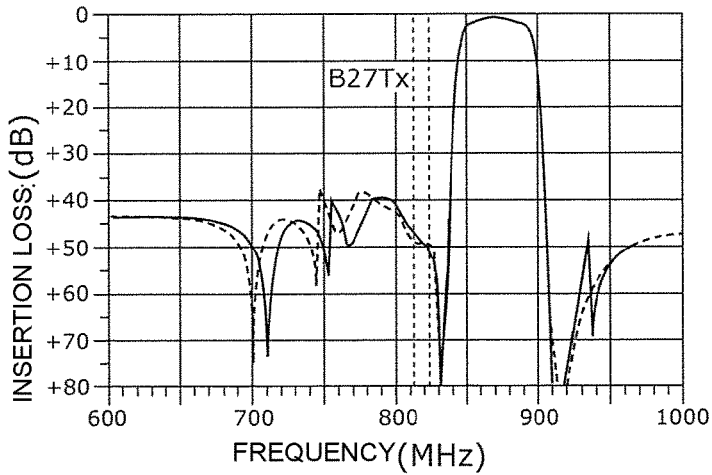
FIG. 9A is a graph illustrating bandpass characteristics of the other variable filter according to Embodiment 2 when mode b1 is selected.

FIG. 9A is a graph illustrating bandpass characteristics of the variable filter 24B according to Embodiment 2 when the mode b1 is selected. In FIG. 9A, bandpass characteristics when the second characteristic (mode b1) in which the pass band is set to the second pass band (B27Rx: 852-869 MHz) is selected are illustrated. In FIG. 9A, the variable filter 24B is selected by the switch 23. In a filter characteristic for the reception band of Band 27 (B27Rx), a predetermined amount of attenuation is required within the transmission band of Band 27 (B27Tx) on the low-frequency side of the pass band, and an attenuation characteristic of about 40 dB is typically required for the transmission band.

If the attenuation characteristic of the variable filter 24B for the transmission band of Band 27 (B27Tx) is changed by the variable filter 24A, which is not selected by the switch 23, and the mode a2 of the variable filter 24A is selected, the attenuation characteristic deteriorates. In the variable filter 24A, which is not selected by the switch 23, therefore, the mode a1 in which the pass band is set to the reception band of Band (B68Rx), which does not overlap with the transmission band of Band 27 (B27Tx), is preferably selected.

Figure 9B:
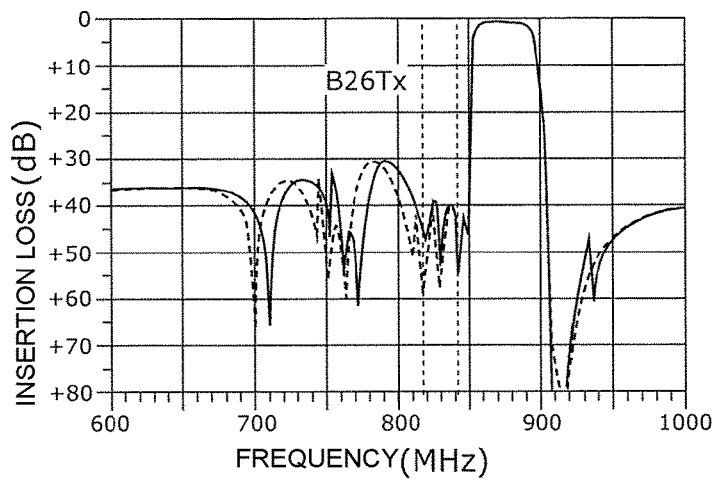
FIG. 9B is a graph illustrating bandpass characteristics of the other variable filter according to Embodiment 2 when mode b2 is selected.

FIG. 9B is a graph illustrating bandpass characteristics of the variable filter 24B according to Embodiment 2 when the mode b2 is selected. In FIG. 9B, bandpass characteristics when the fourth characteristic (mode b2) in which the pass band is set to the fourth pass band (B26Rx: 859-894 MHz) is selected are illustrated. In FIG. 9B, the variable filter 24B is selected by the switch 23. In a filter characteristic for the reception band of Band 26 (B26Rx), a predetermined amount of attenuation is required within the transmission band of Band 26 (B26Tx) on the low-frequency side of the pass band, and an attenuation characteristic of about 40 dB is typically required for the transmission band.

If the attenuation characteristic of the variable filter 24B for the transmission band of Band 26 (B26Tx) is changed by the variable filter 24A, which is not selected by the switch 23, and the mode a2 of the variable filter 24A is selected, the attenuation characteristic deteriorates. In the variable filter 24A, which is not selected by the switch 23, therefore, the mode a1 in which the pass band is set to the reception band of Band (B68Rx), which does not overlap with the transmission band of Band 26 (B26Tx), is preferably selected.

With the configuration described above, when the variable filter 24B is selected by the switch 23 and when the second characteristic (mode b1) in which the pass band is set to the second pass band (B27Rx: 852-869 MHz) or the fourth characteristic (mode b2) in which the pass band is set to the fourth pass band (B26Rx: 859-894 MHz) is selected, in the variable filter 24A, which is not selected by the switch 23, the fifth characteristic (mode a1) in which the pass band is set to the reception band of Band 68 (B68Rx), which does not overlap with the second pass band or the fourth pass band, is selected. Thus, a compact multiplexer supporting four or more bands can be obtained.

The operation principle of shifting the pass band with the circuit configuration described above will be described in detail with reference to FIG. 10 and the following figures.

Examples of the switches $1s11$ to $1s32$ and $2s11$ to $2s32$ include a GaAs or CMOS (Complementary Metal Oxide Semiconductor) FET (Field Effect Transistor) switch and a diode switch. Thus, the switches $1s11$ to $1s32$ and $2s11$ to $2s32$ can be formed by a single FET switch or diode switch, and therefore compact variable filters 24A and 24B can be obtained.

Each of the variable filters 24A and 24B may further include a longitudinally coupled filter circuit between the input end and output end thereof.

Accordingly, a filter characteristic in which attenuation enhancement or the like is required can be satisfied.

The capacitors $1c11$ to $1c32$ and $2c11$ to $2c32$ may be each a variable impedance element. Examples of the variable impedance element include a variable capacitor such as a varicap and a DTC (Digitally Tunable Capacitor), and a MEMS (Micro Electro Mechanical Systems) variable inductor. This enables fine adjustment of the frequency variable width.

Alternatively, impedance elements such as the capacitors $1c11$ to $1c32$ and $2c11$ to $2c32$ may be constituted by chip components.

The impedance elements described above may be disposed on a filter substrate having elastic wave resonators constituting each variable filter, or may be disposed in a mounting substrate on which the filter substrate is mounted. Alternatively, the impedance elements may be arranged in a package having the switches $1s11$ to $1s32$ illustrated in FIG. 6A and the switches $2s11$ to $2s32$ illustrated in FIG. 6B. These configurations can achieve a more compact filter device.

Preferably, the switch 23 illustrated in FIG. 3, the switches $1s11$ to $1s32$ illustrated in FIG. 6A, and the switches $2s11$ to $2s32$ illustrated in FIG. 6B are arranged in a single package. This can achieve a more compact filter device.

[2.6 Resonator Configuration of Variable Filter]

In this embodiment, resonators constituting the variable filters 24A and 24B are resonators that use surface acoustic waves. Accordingly, the variable filters 24A and 24B can be constituted by IDT (InterDigital Transducer) electrodes disposed on an at least partially piezoelectric substrate, and thus a compact, low-profile filter device having a steep bandpass characteristic can be obtained. The structure of a surface acoustic wave resonator will now be described.

Figure 10:
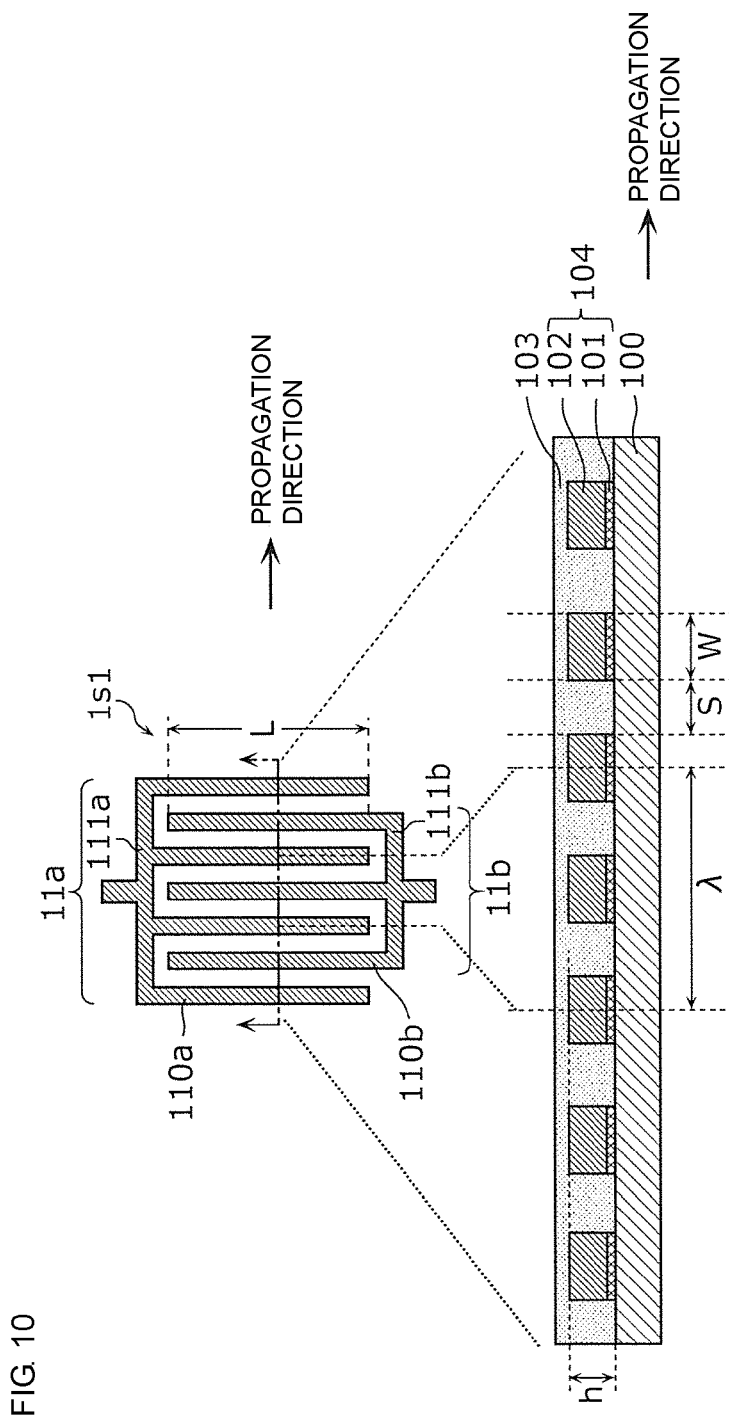
FIG. 10 is an example plan view and sectional view schematically illustrating each resonator in the variable filters according to Embodiment 2.

FIG. 10 is an example plan view and sectional view schematically illustrating each resonator in the filters 24A and 24B according to Embodiment 2. In FIG. 10, a schematic plan view and a schematic sectional view depicting the structure of the series-arm resonator 1s1 among the resonators constituting the filters 24A and 24B are exemplarily illustrated. The series-arm resonator illustrated in FIG. 10 is for the illustration of a typical structure of the plurality of resonators described above, and the number, length, and the like of electrode fingers constituting an electrode are not limited thereto.

Each resonator in the filters 24A and 24B is constituted by a piezoelectric substrate 100, and comb-shaped IDT electrodes 11a and 11b.

As illustrated in the plan view in FIG. 10, a pair of opposing IDT electrodes 11a and 11b is disposed on the piezoelectric substrate 100. The IDT electrode 11a is constituted by a plurality of electrode fingers 110a that are parallel to each other, and a busbar electrode 111a that connects the plurality of electrode fingers 110a to each other. The IDT electrode 11b is constituted by a plurality of electrode fingers 110b that are parallel to each other, and a busbar electrode 111b that connects the plurality of electrode fingers 110b to each other. The pluralities of electrode fingers 110a and 110b are disposed in a direction perpendicular to the propagation direction.

Further, as illustrated in the sectional view in FIG. 10, IDT electrodes 104, which are constituted by the pluralities of electrode fingers 110a and 110b and the busbar electrodes 111a and 111b, have a multilayer structure of a close contact layer 101 and a main electrode layer 102.

The close contact layer 101 is a layer for enhancing the contact between the piezoelectric substrate 100 and the main electrode layer 102, and is made of, for example, Ti. The close contact layer 101 has a film thickness of, for example, 12 nm.

The main electrode layer 102 is made of, for example, Al containing 1% of Cu. The main electrode layer 102 has a film thickness of, for example, 162 nm.

A protection layer 103 is disposed in such a manner as to cover the IDT electrodes 11a and 11b. The protection layer 103 is a layer for purposes such as protection of the main electrode layer 102 from the outside environment, adjustment of the frequency temperature characteristics, and enhancement in humidity resistance, and is a film containing, for example, silicon dioxide as a main component.

The materials of the close contact layer 101, the main electrode layer 102, and the protection layer 103 are not limited to those described above. In addition, the IDT electrodes 104 may not necessarily have the multilayer structure described above. The IDT electrodes 104 may be composed of a metal such as Ti, Al, Cu, Pt, Au, Ag, or Pd, or an alloy, or may be composed of a plurality of multilayer bodies composed of the metal or alloy. Further, the protection layer 103 is optional.

The piezoelectric substrate 100 is formed of, for example, $LiTaO_3$ piezoelectric single crystal, $LiNbTaO_3$ piezoelectric single crystal, or piezoelectric ceramics. It is desirable that the piezoelectric substrate 100 be an at least partially piezoelectric substrate. For example, the piezoelectric substrate 100 may be formed of a multilayer body having a piezoelectric thin film on a surface thereof and including a film having a different acoustic velocity from the piezoelectric thin film, a support substrate, and so on. For example, the piezoelectric substrate 100 may be a multilayer body including a high-acoustic-velocity support substrate and a piezoelectric thin film disposed on the high-acoustic-velocity support substrate, a multilayer body including a high-acoustic-velocity support substrate, a low-acoustic-velocity film disposed on the high-acoustic-velocity support substrate, and a piezoelectric thin film disposed on the low-acoustic-velocity film, or a multilayer body including a support substrate, a high-acoustic-velocity film disposed on the support substrate, a low-acoustic-velocity film disposed on the high-acoustic-velocity film, and a piezoelectric thin film disposed on the low-acoustic-velocity film.

The structure of each of the resonators included in the filters 24A and 24B is not limited to the structure illustrated in FIG. 10. For example, the IDT electrodes 104 may be formed of a single layer of a metal film, instead of having a multilayer structure of metal films.

Furthermore, each resonator in the filters 24A and 24B may be, instead of a surface acoustic wave resonator, a boundary acoustic wave resonator or a resonator that uses a BAW (Bulk Acoustic Wave). That is, it is desirable that each resonator have a "resonant frequency", which is a singularity at which the impedance reaches a local minimum (ideally, a point at which the impedance reaches 0), and an "antiresonant frequency", which is a singularity at which the impedance reaches a local maximum (ideally, a point at which the impedance becomes infinite).

[2.7 Operation Principle 1 of Variable Filter (Tunable Filter)]

The bandpass characteristic of the variable filter 24A illustrated in FIG. 6A is set to the fifth characteristic in accordance with a control signal Sa1 (see FIG. 3) for turning on all of the switches 1s11 to 1s32, and to the first characteristic in accordance with a control signal Sa2 (see FIG. 3) for turning off all of the switches 1s11 to 1s32. The bandpass characteristic of the variable filter 24B illustrated in FIG. 6B is set to the second characteristic in accordance with a control signal Sb1 (see FIG. 3) for turning on all of the switches 2s11 to 2s32, to the fourth characteristic in accordance with a control signal Sb2 (see FIG. 3) for turning off the switches 2s11 to 2s31 and turning on the switches 2s12 to 2s32, and to the third characteristic in accordance with a control signal Sb3 (see FIG. 3) for turning off all of the switches 2s11 to 2s32. In the following, the bandpass characteristic of the variable filter 24B will be described with reference to FIG. 11A to FIG. 13C. Further, the bandpass characteristic of the variable filter 24A will be described with reference to FIG. 14 to FIG. 15.

In the following description, the operation principle of the variable filters 24A and 24B will be described using variable filters 24C to 24E, which are obtained by simplifying the circuit configuration of the variable filters 24A and 24B. More specifically, the variable filters 24A and 24B have a multi-stage configuration, where each stage is constituted by a combination of one series-arm resonator and two parallel-arm resonators. In contrast, the variable filters 24C to 24E have a single stage of the combination described above.

Further, the variable filter 24B has a configuration in which, for example, three circuits (the capacitor 2c11/the switch 2s11/the series-connected circuit of the capacitor 2c12 and the switch 2s12) are connected in parallel to each other and connected to the parallel-arm resonator 2p12. In contrast, the variable filters 24C and 24D have a configuration in which two circuits (capacitor/switch) are connected in parallel to each other and connected to a parallel-arm resonator.

Note that the variable filters 24A and 24B and the simplified variable filters 24C to 24E have substantially the same operation principle.

Figure 11A:
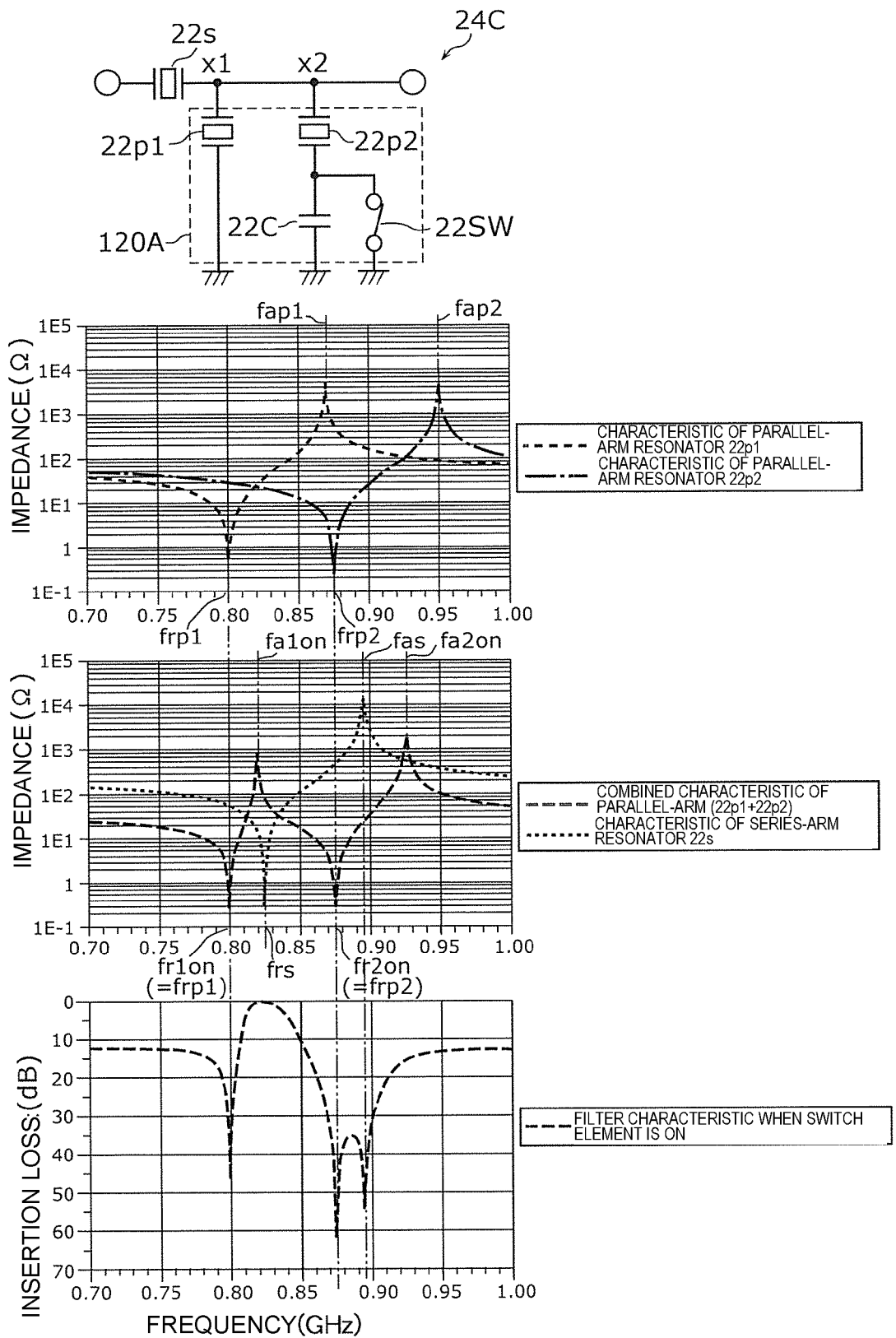
FIG. 11A is a graph illustrating impedance characteristics and a bandpass characteristic of a variable filter according to Embodiment 2 during a switch-on period.
Figure 11B:
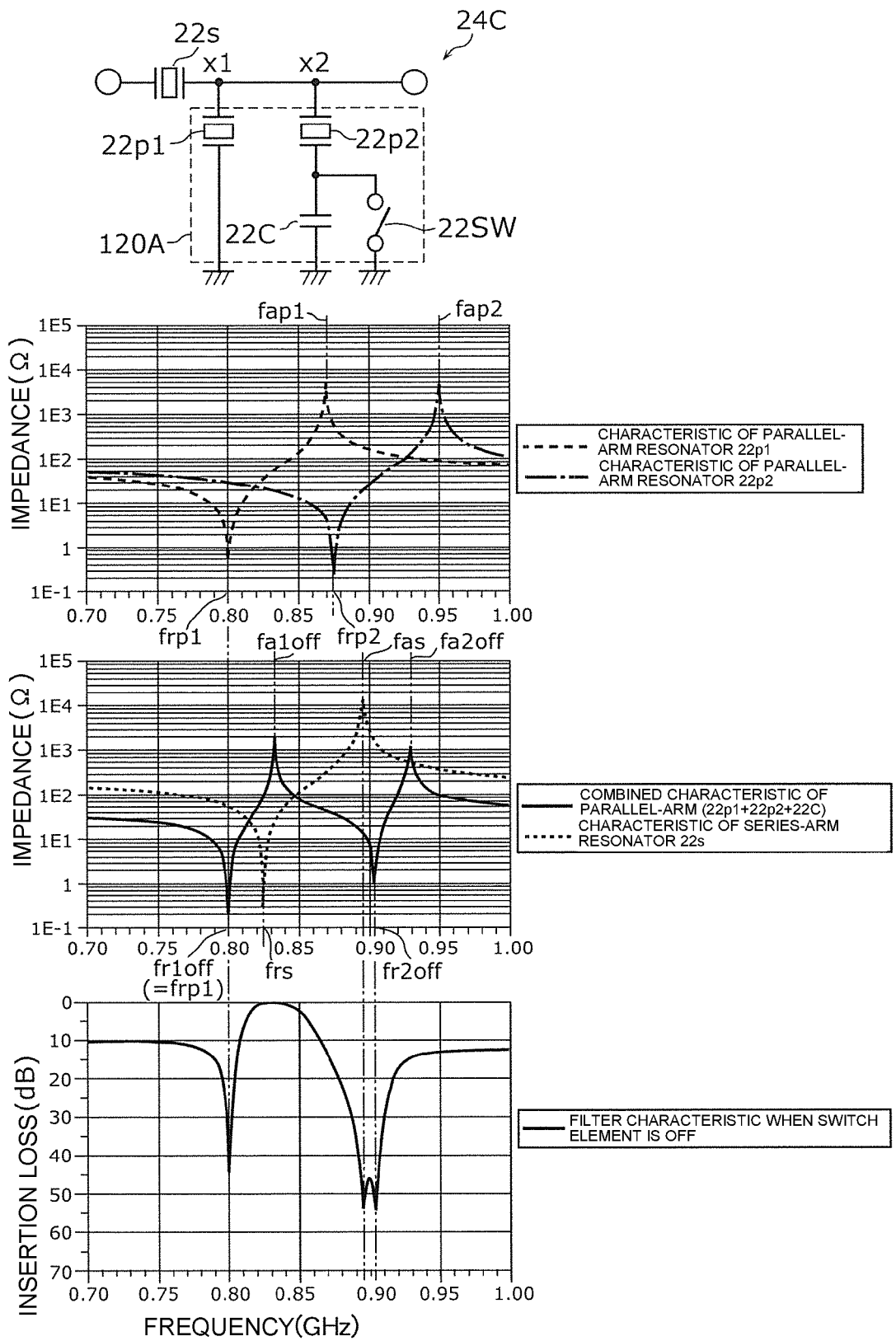
FIG. 11B is a graph illustrating impedance characteristics and a bandpass characteristic of the variable filter according to Embodiment 2 during a switch-off period.
Figure 11C:
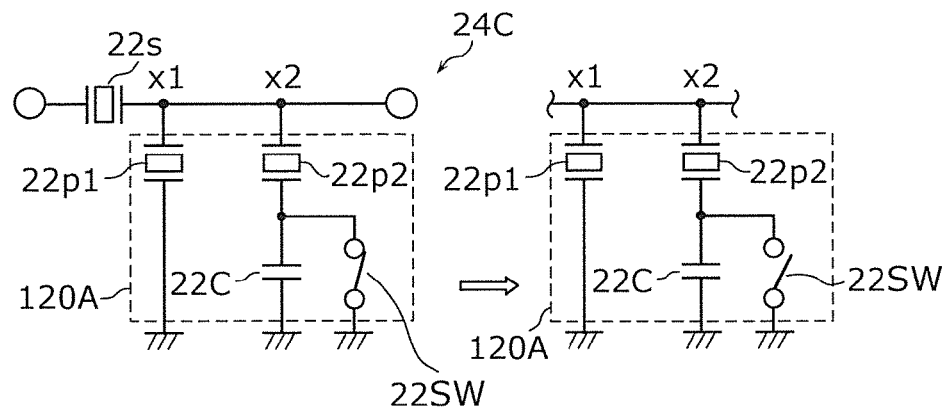
FIG. 11C is a graph illustrating a comparison of the impedance characteristics and bandpass characteristics of the variable filter according to Embodiment 2 during the switch-on period and the switch-off period.
Figure 11C:
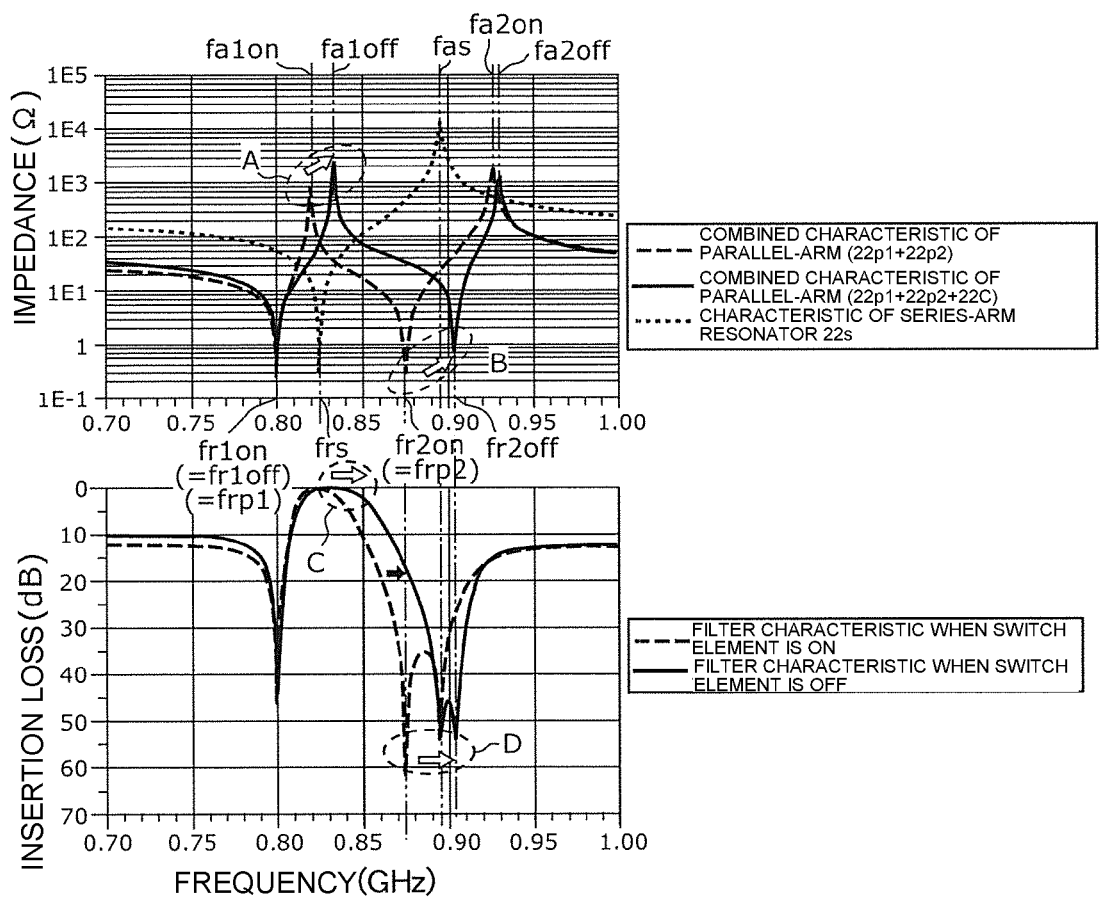

FIG. 11A is a graph illustrating impedance characteristics and a bandpass characteristic of the variable filter 24C when a switch 22SW is on. FIG. 11B is a graph illustrating impedance characteristics and a bandpass characteristic of the variable filter 24C when the switch 22SW is off. FIG. 11C is a graph illustrating a comparison of the impedance characteristics and bandpass characteristics of the variable filter 24C when the switch 22SW is on and off. The variable filter 24C illustrated in FIG. 11A to FIG. 11C is for the illustration of the operation principle of the variable filter 24B according to Embodiment 2.

First, the impedance characteristic of a resonator alone will be described with reference to FIG. 11A. In the following, a singularity at which the impedance reaches a local minimum (ideally, a point at which the impedance reaches 0) is referred to as "resonant point" for not only resonators but also parallel-arm circuits, for convenience, and the frequency at this point is referred to as "resonant frequency". Further, a singularity at which the impedance reaches a local maximum (ideally, a point at which the impedance becomes infinite) is referred to as "anti-resonant point", and the frequency at this point is referred to as "anti-resonant frequency".

As illustrated in FIG. 11A, a series-arm resonator 22s, a parallel-arm resonator 22p1, and a parallel-arm resonator 22p2 have the following impedance characteristics. Specifically, the parallel-arm resonator 22p1 has a resonant frequency frp1 and an anti-resonant frequency fap1 (in this case, frp1<fap1 is satisfied). The parallel-arm resonator 22p2 has a resonant frequency frp2 and an anti-resonant frequency fap2 (in this case, frp1<frp2<fap2 is satisfied). The series-arm resonator 22s has a resonant frequency frs and an anti-resonant frequency fas (in this case, frs<fas and frp1<frs<frp2 are satisfied).

Then, the impedance characteristic of a parallel-arm circuit 120A will be described.

As illustrated in FIG. 11A, when the switch 22SW is on, the impedance characteristic of the parallel-arm circuit 120A is a characteristic that is not affected by a capacitor 22C. That is, in this state, the combined characteristic of the two parallel-arm resonators (the parallel-arm resonators 22p1 and 22p2) ("combined characteristic of parallel-arm (22p1+22p2)" in FIG. 11A) corresponds to the impedance characteristic of the parallel-arm circuit 120A.

Specifically, when the switch 22SW is on, the parallel-arm circuit 120A has the following impedance characteristic.

The parallel-arm circuit 120A has two resonant frequencies fr1on and fr2on (in this case, fr1on=frp1 and fr2on=frp2 are satisfied). That is, the impedance of the parallel-arm circuit 120A reaches a local minimum at (i) the resonant frequency of the parallel-arm resonator 22p1 included in the parallel-arm circuit 120A and at (ii) a frequency higher than the resonant frequency of the parallel-arm resonator 22p2.

Further, the parallel-arm circuit 120A has two anti-resonant frequencies fa1on and fa2on (in this case, fr1on<fa1on<fr2on<fa2on, fa1on<fap1, and fa2on<fap2 are satisfied). That is, the impedance of the parallel-arm circuit 120A reaches a local maximum at (i) a frequency between the resonant frequencies of the parallel-arm resonators 22p1 and 22p2 included in the parallel-arm circuit 120A and at (ii) a frequency between the anti-resonant frequencies of the two parallel-arm resonators 22p1 and 22p2.

The reason that fa1on<fap1 is satisfied is that the parallel-arm resonator 22p2 acts as a parallel capacitor for the parallel-arm resonator 22p1 within a frequency band near the anti-resonant frequency fap1 of the parallel-arm resonator 22p1. Further, the reason that fa2on<fap2 is satisfied is that the parallel-arm resonator 22p1 acts as a parallel capacitor for the parallel-arm resonator 22p2 within a frequency band near the anti-resonant frequency fap2 of the parallel-arm resonator 22p2.

Specifically, when the switch 22SW is on, in the parallel-arm circuit 120A, resonance occurs between a resonator (here, the parallel-arm resonator 22p1) and a capacitor (here, the parallel-arm resonator 22p2) as the frequency increases from the resonant frequency frp1 at which the parallel-arm resonator 22p1 resonates and as the frequency becomes close to the anti-resonant frequency fap1. That is, referring to a conceptual equivalent circuit of the parallel-arm circuit 120A, an LC series circuit constituting a resonator (the parallel-arm resonator 22p1) and a capacitor connected in parallel thereto resonate with a capacitor (the parallel-arm resonator 22p2) connected in parallel to the resonator. Thus, in the parallel-arm circuit 120A, the impedance reaches a local maximum (anti-resonance) at a frequency (fa1on) lower than the anti-resonant frequency fap1. With a similar mechanism, also when the frequency increases from the resonant frequency frp2 and becomes close to the anti-resonant frequency fap2, the impedance reaches a local maximum (anti-resonance) at a frequency (fa2on) lower than the anti-resonant frequency fap2.

For the construction of a band pass filter using ladder resonators, the anti-resonant frequency fa1on of the parallel-arm circuit 120A and the resonant frequency frs of the series-arm resonator 22s are set close to each other. Accordingly, when the switch 22SW is on, frequencies near the resonant frequency fr1on at which the impedance of the parallel-arm circuit 120A is close to 0 correspond to a low-frequency-side stop band. At higher frequencies, the impedance of the parallel-arm circuit is higher at frequencies near the anti-resonant frequency fa1on and the impedance of the series-arm resonator 22s is closer to 0 at frequencies near the resonant frequency frs. Accordingly, frequencies near the anti-resonant frequency fa1on and the resonant frequency frs correspond to a signal pass band in a signal path (series arm) from an input/output terminal 22m to an input/output terminal 22n. Still higher frequencies near the resonant frequency fr2on and the anti-resonant frequency fas, at which the impedance of the series-arm resonator 22s is higher and the impedance of the parallel-arm circuit 120A is closer to 0, correspond to a high-frequency-side stop band.

That is, when the switch 22SW is on, the variable filter 24C has a first bandpass characteristic in which the pass band is defined by the anti-resonant frequency fa1on and the resonant frequency frs, the pole (attenuation pole) on the low-frequency side of the pass band is defined by the resonant frequency fr1on, and the pole (attenuation pole) on the high-frequency side of the pass band is defined by the resonant frequency fr2on and the anti-resonant frequency fas.

Note that the anti-resonant frequency fa2on of the parallel-arm circuit does not have a large effect on the bandpass characteristic (here, the first bandpass characteristic) of the variable filter 24C since the impedance of the series-arm resonator 22s is high at the anti-resonant frequency fa2on.

As illustrated in FIG. 11B, when the switch 22SW is off, in contrast, the impedance characteristic of the parallel-arm circuit 120A is a characteristic that is affected by the capacitor 22C. That is, in this state, the combined characteristic of the two parallel-arm resonators (the parallel-arm resonators 22p1 and 22p2) and the capacitor 22C ("combined characteristic of parallel-arm (22p1+22p2+22C)" in FIG. 11B) corresponds to the impedance characteristic of the parallel-arm circuit 120A.

Specifically, when the switch 22SW is off, the parallel-arm circuit 120A has the following impedance characteristic.

The parallel-arm circuit 120A has two resonant frequencies fr1off and fr2off and two anti-resonant frequencies fa1off and fa2off (in this case, fr1off<fa1off<fr2off<fa2off, fa1off<fap1, frp2<fr2off, and fa2off<fap2 are satisfied). That is, the impedance of the parallel-arm circuit 120A reaches a local minimum at (i) the resonant frequency of the parallel-arm resonator 22p1 included in the parallel-arm circuit 120A and at (ii) a frequency higher than the resonant frequency of the parallel-arm resonator 22p2. Further, the impedance of the parallel-arm circuit 120A reaches a local maximum at (i) a frequency between the resonant frequencies of the parallel-arm resonators 22p1 and 22p2 included in the parallel-arm circuit 120A and at (ii) a frequency between the anti-resonant frequencies of the two parallel-arm resonators 22p1 and 22p2.

The reason that fa1off<fap1 is satisfied is that the parallel-arm resonator 22p2 acts as a capacitor for the parallel-arm resonator 22p1 within a frequency band near the anti-resonant frequency fap1 of the parallel-arm resonator 22p1. Further, the reason that frp2<fr2off is satisfied is that resonance occurs between the parallel-arm resonator 22p2 and the capacitor 22C within a frequency band near the resonant frequency frp2 of the parallel-arm resonator 22p2. Further, the reason that fa2off<fap2 is satisfied is that the parallel-arm resonator 22p1 acts as a capacitor for the parallel-arm resonator 22p2 within a frequency band near the anti-resonant frequency fap2 of the parallel-arm resonator 22p2.

Specifically, when the switch 22SW is off, in the parallel-arm circuit 120A, resonance occurs between a resonator (here, the parallel-arm resonator 22p1) and a capacitor (here, the parallel-arm resonator 22p2 and the capacitor 22C) as the frequency increases from the resonant frequency frp1 at which the parallel-arm resonator 22p1 resonates and as the frequency becomes close to the anti-resonant frequency fap1. That is, referring to a conceptual equivalent circuit of the parallel-arm circuit 120A, an LC series circuit constituting a resonator (the parallel-arm resonator 22p1) and a capacitor connected in parallel thereto resonate with a capacitor (the parallel-arm resonator 22p2 and the capacitor 22C) connected in parallel to the resonator. Thus, in the parallel-arm circuit 120A, the impedance reaches a local maximum (anti-resonance) at a frequency (fa1off) lower than the anti-resonant frequency fap1. With a similar mechanism, also when the frequency increases from the resonant frequency frp2 and becomes close to the anti-resonant frequency fap2, the impedance reaches a local maximum (anti-resonance) at a frequency (fa2off) lower than the anti-resonant frequency fap2. In addition, resonance occurs between the parallel-arm resonator 22p2 and the capacitor 22C as the frequency increases from the anti-resonant frequency fa1off and becomes close to the resonant frequency frp2. That is, referring to a conceptual equivalent circuit of the parallel-arm circuit 120A, an LC series circuit constituting a resonator (the parallel-arm resonator 22p2) and a capacitor connected in parallel thereto resonate with a capacitor (the capacitor 22C) connected in parallel to the resonator. Thus, in the parallel-arm circuit, the impedance reaches a local minimum (resonance) at a frequency (fr2off) higher than the resonant frequency frp2.

At this time, as a result of a comparison of the anti-resonant frequency on the low-frequency side between when the switch 22SW is off and when the switch 22SW is on, fa1on<fa1off is satisfied. This is because when the switch 22SW is off, due to the effect of the capacitor 22C, the frequency variable width from the anti-resonant frequency fap1 of the parallel-arm resonator 22p1 is narrower than that when the switch 22SW is on.

Further, as a result of a comparison of the resonant frequency on the high-frequency side between when the switch 22SW is off and when the switch 22SW is on, fr2on<fr2off is satisfied. This is because when the switch 22SW is off, due to the effect of the capacitor 22C, fr2on (=frp2)<fr2off is satisfied, as described above, compared with when the switch 22SW is on.

For the construction of a band pass filter using ladder resonators, the anti-resonant frequency fa1off of the parallel-arm circuit 120A and the resonant frequency frs of the series-arm resonator 22s are set close to each other. Accordingly, when the switch 22SW is off, frequencies near the resonant frequency fr1off at which the impedance of the parallel-arm circuit 120A is close to 0 correspond to a low-frequency-side stop band. At higher frequencies, the impedance of the parallel-arm circuit is higher at frequencies near the anti-resonant frequency fa1off and the impedance of the series-arm resonator 22s is closer to 0 at frequencies near the resonant frequency frs. Accordingly, frequencies near the anti-resonant frequency fa1off and the resonant frequency frs correspond to a signal pass band in a signal path (series arm) from the input/output terminal 22m to the input/output terminal 22n. Still higher frequencies near the resonant frequency fr2off and the anti-resonant frequency fas, at which the impedance of the series-arm resonator 22s is higher and the impedance of the parallel-arm circuit 120A is closer to 0, correspond to a high-frequency-side stop band.

That is, when the switch 22SW is off, the variable filter 24C has a second bandpass characteristic in which the pass band is defined by the anti-resonant frequency fa1off and the resonant frequency frs, the pole (attenuation pole) on the low-frequency side of the pass band is defined by the resonant frequency fr1off, and the pole (attenuation pole) on the high-frequency side of the pass band is defined by the resonant frequency fr2off and the anti-resonant frequency fas.

Note that, as in the anti-resonant frequency fa2on described above, the anti-resonant frequency fa2off of the parallel-arm circuit does not have a large effect on the bandpass characteristic (here, the second bandpass characteristic) of the variable filter 24C since the impedance of the series-arm resonator 22s is high at the anti-resonant frequency fa2off.

Then, the impedance characteristics and bandpass characteristics of the variable filter 24C when the switch 22SW is on and off are compared in detail with reference to FIG. 11C.

As illustrated in FIG. 11C, when the switch 22SW is switched from on to off, the impedance characteristic of the parallel-arm circuit 120A changes in the following manner. In the parallel-arm circuit 120A, the higher resonant frequency among the two resonant frequencies and the lower anti-resonant frequency among the two anti-resonant frequencies shift to higher ranges. In this embodiment, only the parallel-arm resonator 22p2 is connected in series with the capacitor 22C and the switch 22SW, and thus the higher resonant frequency among the two resonant frequencies shifts to a higher range from fr2on to fr2off (portion B in FIG. 11C). In addition, the lower anti-resonant frequency shifts to a higher range from fa1on to fa1off (portion A in FIG. 11C).

The lower anti-resonant frequency and the higher resonant frequency of the parallel-arm circuit 120A, which define the attenuation slope on the high-frequency side of the pass band of the variable filter 24C, shift to higher ranges, as described above. Thus, as depicted in a lower portion of FIG. 11C, the switch 22SW is switched from on to off, thereby shifting the bandpass characteristic of the variable filter 24C to a higher range while maintaining the steepness of the attenuation slope on the high-frequency side of the pass band (see the solid black arrow in FIG. 11C). In other words, the variable filter 24C can shift the bandpass characteristic to a higher range (portion C in FIG. 11C) with the appearance of a shoulder on the high-frequency side of the pass band while shifting the attenuation pole on the high-frequency side of the pass band to a higher range (portion D in FIG. 11C).

[2.8 Operation Principle 2 of Variable Filter (Tunable Filter)]

The operation principle 1 has been described for the variable filter 24C that switches the pass band by shifting the attenuation slope on the high-frequency side of the pass band. In contrast, as illustrated in FIG. 7B, the variable filter 24B according to Embodiment 2 switches the pass band by shifting the attenuation slope on the low-frequency side of the pass band. A description will now be given of a variable filter 24D that switches the pass band by shifting the attenuation slope on the low-frequency side of the pass band.

Figure 12:
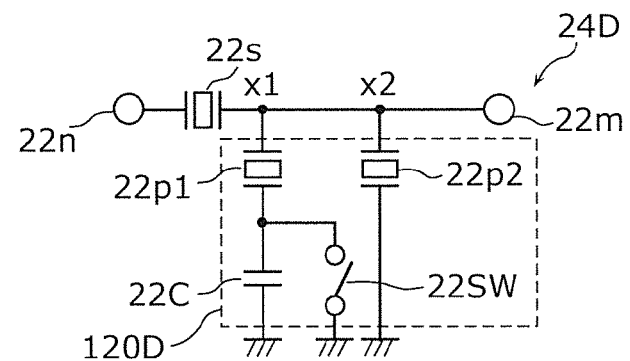
FIG. 12 is a circuit configuration diagram of a variable filter according to Modification 1 of Embodiment 2.

FIG. 12 is a circuit configuration diagram of the variable filter 24D. In the variable filter 24D illustrated in FIG. 12, unlike the variable filter 24C illustrated in FIG. 11A, the capacitor 22C and the switch 22SW are connected in series with only the parallel-arm resonator 22p1. The following description focuses on different points from the variable filter 24C, with the description of the same points omitted.

The capacitor 22C and the switch 22SW are connected in series with the parallel-arm resonator 22p1 between a node x1 and ground, and, specifically, are connected in series between ground and the parallel-arm resonator 22p1. The capacitor 22C and the switch 22SW may be connected in series between the node x1 and the parallel-arm resonator 22p1.

The capacitor 22C is an impedance element connected in series with the parallel-arm resonator 22p1. The frequency variable width of the pass band of the variable filter 24D depends on the constant of the capacitor 22C. For example, the frequency variable width increases as the constant of the capacitor 22C decreases. Thus, the constant of the capacitor 22C may be determined, as desired, in accordance with the frequency specifications required for the variable filter 24D.

The parallel-arm resonators 22p1 and 22p2, the capacitor 22C, and the switch 22SW constitute a parallel-arm circuit 120D connected between ground and a node on a path connecting an input/output terminal 22m and an input/output terminal 22n to each other.

Figure 13A:
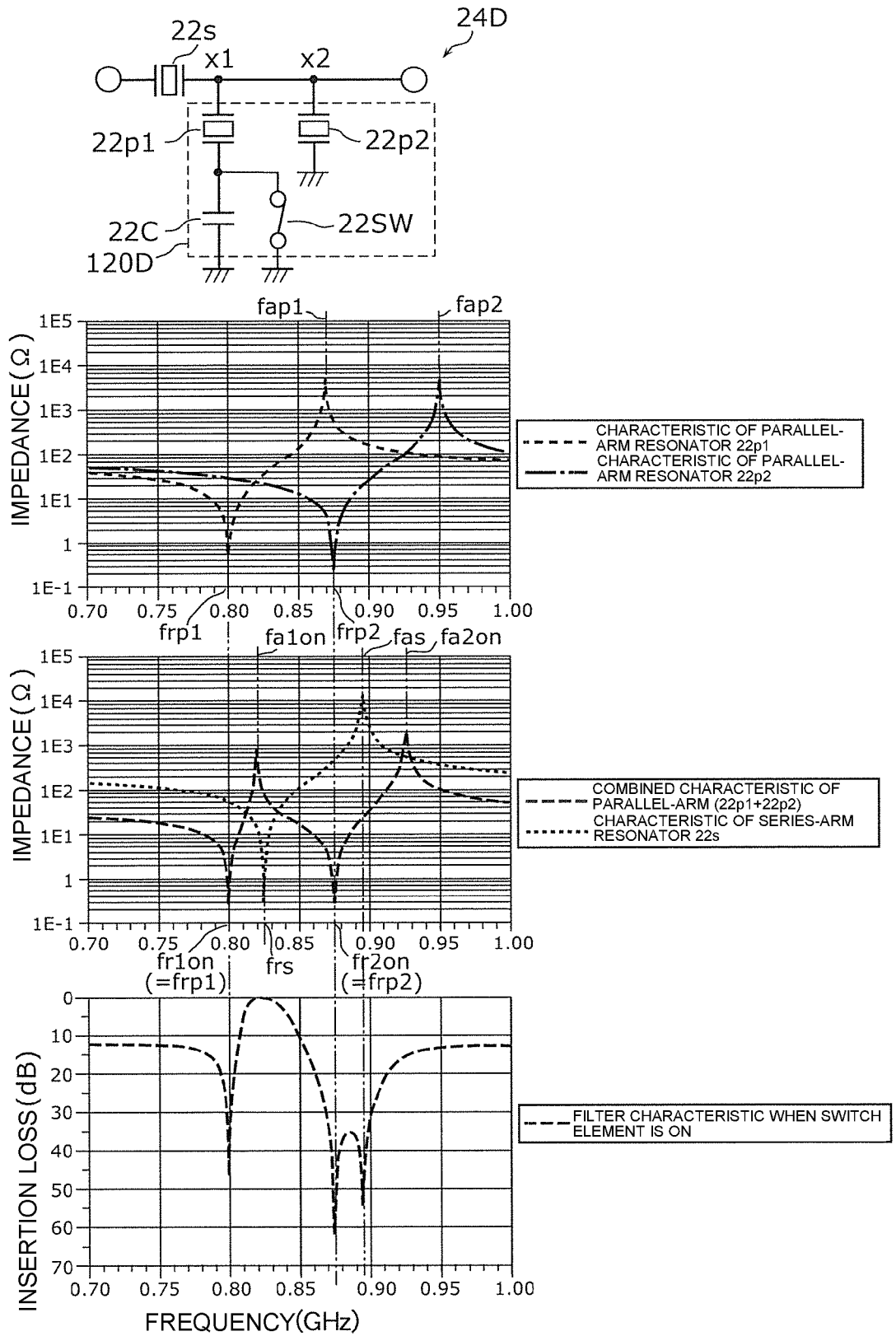
FIG. 13A is a graph illustrating impedance characteristics and a bandpass characteristic of the variable filter according to Modification 1 of Embodiment 2 during a switch-on period.
Figure 13B:
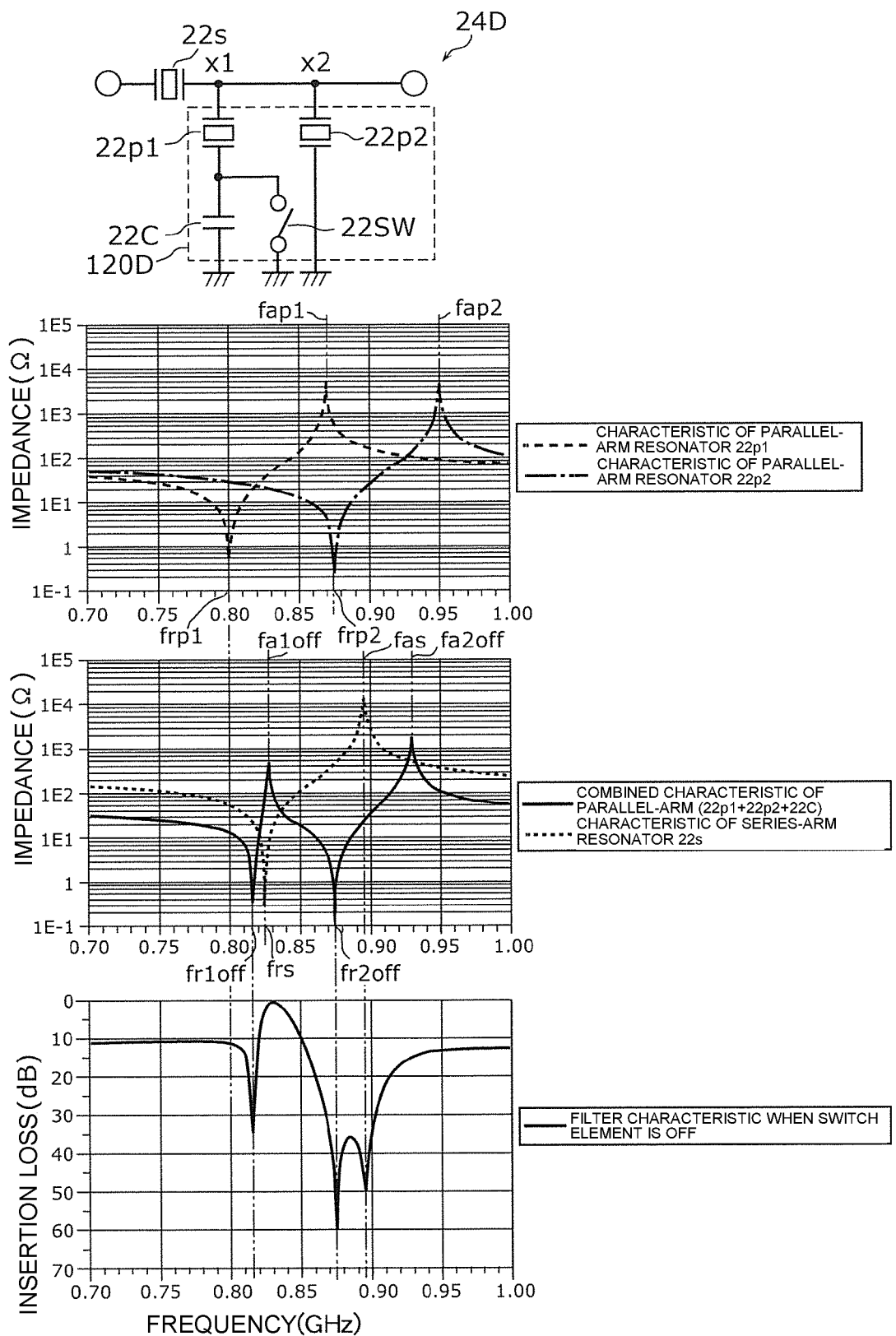
FIG. 13B is a graph illustrating impedance characteristics and a bandpass characteristic of the variable filter according to Modification 1 of Embodiment 2 during a switch-off period.
Figure 13C:
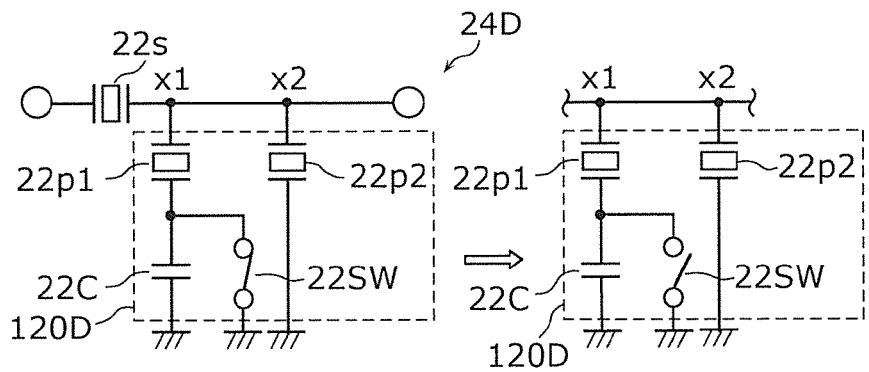
FIG. 13C is a graph illustrating a comparison of the impedance characteristics and bandpass characteristics of the variable filter according to Modification 1 of Embodiment 2 during the switch-on period and the switch-off period.
Figure 13C:
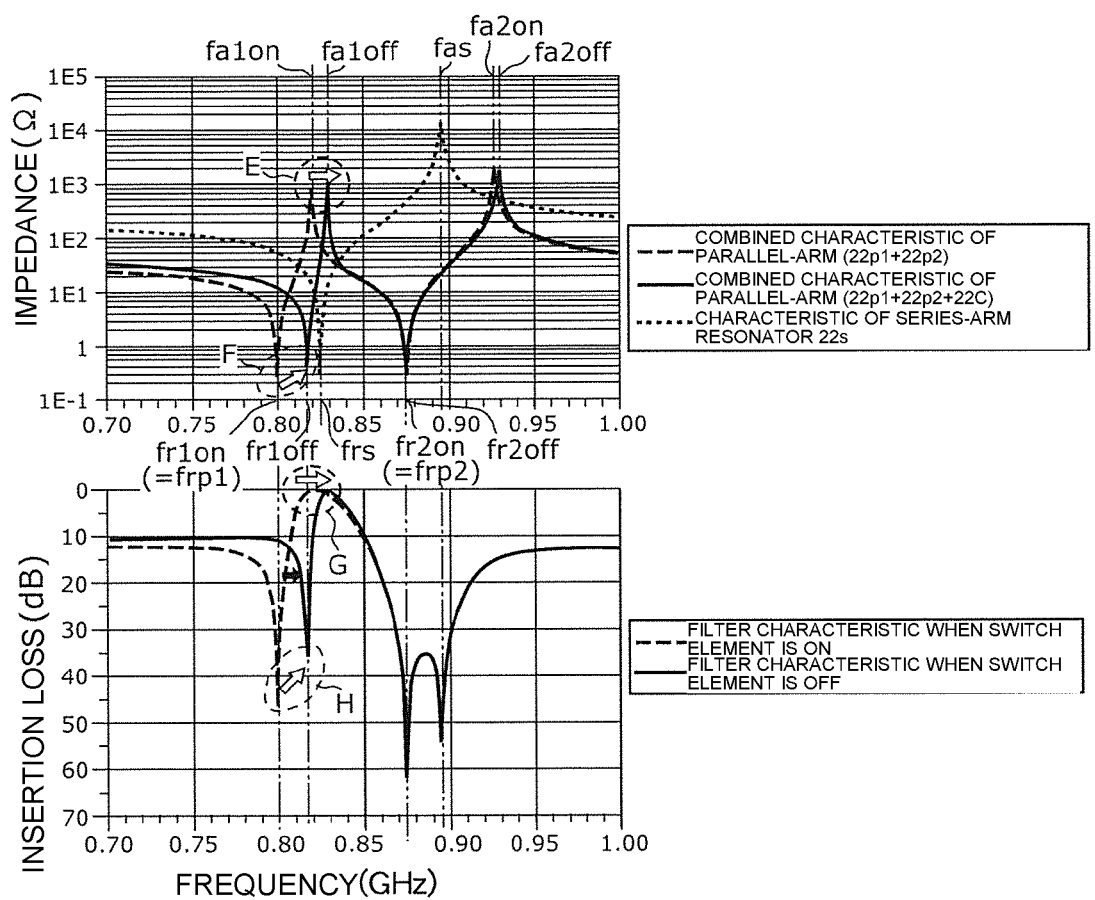

FIG. 13A is a graph illustrating impedance characteristics and a bandpass characteristic of the variable filter 24D when the switch 22SW is on. FIG. 13B is a graph illustrating impedance characteristics and a bandpass characteristic of the variable filter 24D when the switch 22SW is off. FIG. 13C is a graph illustrating a comparison of the impedance characteristics and bandpass characteristics of the variable filter 24D when the switch 22SW is on and off.

The impedance characteristic of a resonator alone is similar to the characteristic described for the variable filter 24C and will not be described hereinafter, with a description focusing on the impedance characteristic of the parallel-arm circuit 120D.

As illustrated in FIG. 13A, when the switch 22SW is on, the impedance characteristic of the parallel-arm circuit 120D is a characteristic that is not affected by the capacitor 22C. That is, in this state, as with the characteristic described for the variable filter 24C, the combined characteristic of the two parallel-arm resonators (the parallel-arm resonators 22p1 and 22p2) ("combined characteristic of parallel-arm (22p1+22p2)" in FIG. 13A) corresponds to the impedance characteristic of the parallel-arm circuit 120D.

That is, when the switch 22SW is on, the variable filter 24D has a bandpass characteristic similar to that of the variable filter 24C.

As illustrated in FIG. 13B, when the switch 22SW is off, in contrast, the impedance characteristic of the parallel-arm circuit 120D is a characteristic that is affected by the capacitor 22C. That is, in this state, the combined characteristic of the two parallel-arm resonators (the parallel-arm resonators 22p1 and 22p2) and the capacitor 22C ("combined characteristic of parallel-arm (22p1+22p2+22C)" in FIG. 13B) corresponds to the impedance characteristic of the parallel-arm circuit 120D.

Specifically, when the switch 22SW is off, the parallel-arm circuit 120D has the following impedance characteristic.

The parallel-arm circuit 120D has two resonant frequencies fr1off and fr2off and two anti-resonant frequencies fa1off and fa2off (in this case, fr1off<fa1off<fr2off<fa2off, fa1off<fap1, frp1<fr1off, and fa2off<fap2 are satisfied). That is, the impedance of the parallel-arm circuit 120D reaches a local minimum at (i) a frequency higher than the resonant frequency of the parallel-arm resonator 22p1 included in the parallel-arm circuit 120D and at (ii) the resonant frequency of the parallel-arm resonator 22p2. Further, the impedance of the parallel-arm circuit 120D reaches a local maximum at (i) a frequency between the resonant frequencies of the parallel-arm resonators 22p1 and 22p2 included in the parallel-arm circuit 120D and at (ii) a frequency between the anti-resonant frequencies of the two parallel-arm resonators 22p1 and 22p2.

The reason that fa1off<fap2 is satisfied is that the parallel-arm resonator 22p2 acts as a parallel capacitor for the parallel-arm resonator 22p1 within a frequency band near the anti-resonant frequency fap2 of the parallel-arm resonator 22p2. Further, the reason that frp1<fr1off is satisfied is that resonance occurs between the parallel-arm resonator 22p1 and the capacitor 22C within a frequency band near the resonant frequency frp1 of the parallel-arm resonator 22p1. Further, the reason that fa2off<fap2 is satisfied is that the combined characteristic of the parallel-arm resonator 22p1 and the capacitor 22C acts as a parallel capacitor for the parallel-arm resonator 22p2.

The specific mechanism is similar to that for the parallel-arm circuit 120A described above, except that one of the parallel-arm resonator 22p1 and the parallel-arm resonator 22p2 that acts as a resonator and one of the parallel-arm resonator 22p1 and the parallel-arm resonator 22p2 that acts as a capacitor are opposite to those in the parallel-arm circuit 120A, and will not be described herein.

That is, when the switch 22SW is off, the variable filter 24D has a second bandpass characteristic in which the pass band is defined by the anti-resonant frequency fa1off and the resonant frequency frs, the pole (attenuation pole) on the low-frequency side of the pass band is defined by the resonant frequency fr1off, and the pole (attenuation pole) on the high-frequency side of the pass band is defined by the resonant frequency fr2off and the anti-resonant frequency fas.

Then, the impedance characteristics and bandpass characteristics of the variable filter 24D when the switch 22SW is on and off are compared in detail with reference to FIG. 13C.

As illustrated in FIG. 13C, when the switch 22SW is switched from on to off, the impedance characteristic of the parallel-arm circuit 120D changes in the following manner. In the parallel-arm circuit 120D, the lower resonant frequency among the two resonant frequencies and the lower anti-resonant frequency among the two anti-resonant frequencies shift to higher ranges. Only the parallel-arm resonator 22p1 is connected in series with the capacitor 22C and the switch 22SW, and thus the lower resonant frequency among the two resonant frequencies shifts to a higher range from fr1on to fr1off (portion F in FIG. 13C). In addition, the lower anti-resonant frequency shifts to a higher range from fa1on to fa1off (portion E in FIG. 13C).

The lower anti-resonant frequency and the lower resonant frequency of the parallel-arm circuit 120D, which define the attenuation slope on the low-frequency side of the pass band of the variable filter 24D, shift to higher ranges, as described above. Thus, as depicted in a lower portion of FIG. 13C, the switch 22SW is switched from on to off, thereby shifting the bandpass characteristic of the variable filter 24D to a higher range while maintaining the steepness of the attenuation slope on the low-frequency side of the pass band (see the solid black arrow in FIG. 13C). In other words, the variable filter 24D can shift the bandpass characteristic to a higher range (portion G in FIG. 13C) with the appearance of a shoulder on the low-frequency side of the pass band while shifting the attenuation pole on the low-frequency side of the pass band to a higher range (portion H in FIG. 13C).

[2.9 Operation Principle 3 of Variable Filter (Tunable Filter)]

A variable filter having a switchable pass band may shift both the attenuation slope on the high-frequency side of the pass band and the attenuation slope on the low-frequency side of the pass band. The operation principle of the variable filter 24A will be described using the variable filter 24E.

Figure 14:
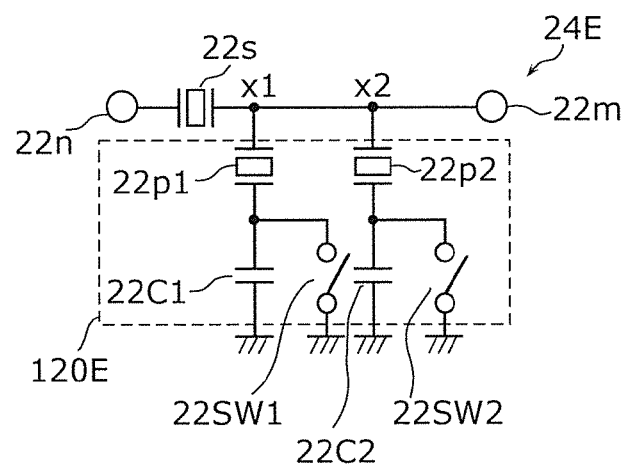
FIG. 14 is a circuit configuration diagram of a variable filter according to Modification 2 of Embodiment 2.

FIG. 14 is a circuit configuration diagram of the variable filter 24E. In the filter 24E illustrated in FIG. 14, unlike the variable filters 24C and 24D, a capacitor 22C1 and a switch 22SW1 are provided for a parallel-arm resonator 22p1 and are connected in series with the parallel-arm resonator 22p1, and a capacitor 22C2 and a switch 22SW2 are provided for a parallel-arm resonator 22p2 and are connected in series with the parallel-arm resonator 22p2. That is, a parallel-arm circuit 120E includes the capacitor 22C1 (impedance element) and the switch 22SW1 (switch element), which are connected in series with one of the parallel-arm resonators 22p1 and 22p2 (here, the parallel-arm resonator 22p1) and which are connected in parallel to each other. The parallel-arm circuit 120E further includes the capacitor 22C2 (impedance element) and the switch 22SW2 (switch element), which are connected in series with the other of the parallel-arm resonators 22p1 and 22p2 (here, the parallel-arm resonator 22p2) and which are connected in parallel to each other.

The capacitor 22C1 and the switch 22SW1 correspond to the capacitor 22C and the switch 22SW in the variable filter 24D described above, and the capacitor 22C2 and the switch 22SW2 correspond to the capacitor 22C and the switch 22SW in the variable filter 24C described above, which will not be described in detail herein.

The parallel-arm resonators 22p1 and 22p2, the capacitors 22C1 and 22C2, and the switches 22SW1 and 22SW2 constitute the parallel-arm circuit 120E connected between ground and a node on a path connecting an input/output terminal 22m and an input/output terminal 22n to each other.

Figure 15:
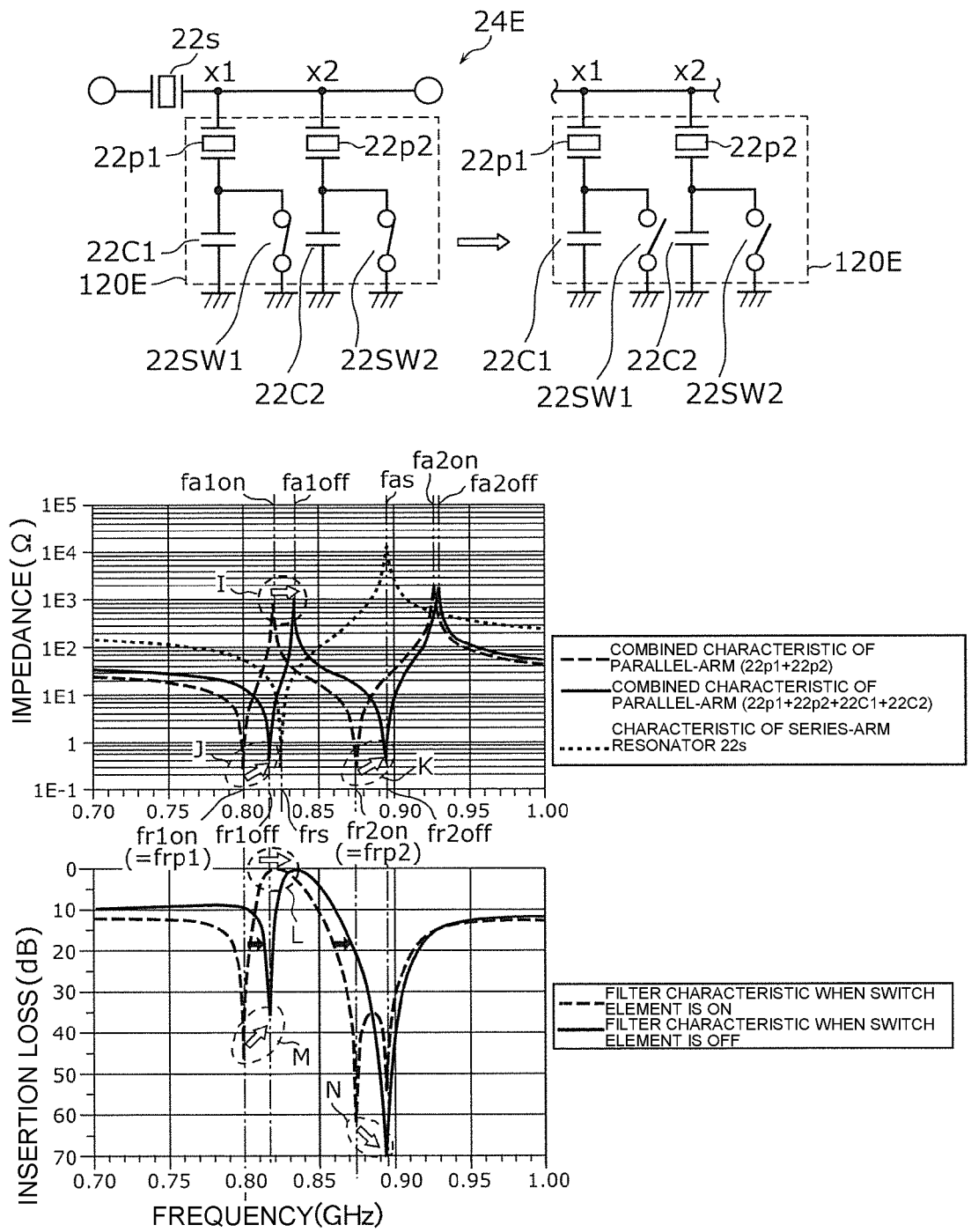
FIG. 15 is a graph illustrating a comparison of the impedance characteristics and bandpass characteristics of the variable filter according to Modification 2 of Embodiment 2 when the switches are on and off.

FIG. 15 is a graph illustrating a comparison of the impedance characteristics and bandpass characteristics of the variable filter 24E when the switches are on and off.

As illustrated in FIG. 15, when both the switches 22SW1 and 22SW2 are on, the impedance characteristic of the parallel-arm circuit 120E is a characteristic that is not affected by the capacitor 22C1 or 22C2. That is, in this state, as with the characteristic described for the variable filter 24C, the combined characteristic of the two parallel-arm resonators (the parallel-arm resonators 22p1 and 22p2) ("combined characteristic of parallel-arm (22p1+22p2)" in FIG. 15) corresponds to the impedance characteristic of the parallel-arm circuit.

That is, when both the switches 22SW1 and 22SW2 are on, the variable filter 24E has a bandpass characteristic similar to the bandpass characteristic of the variable filter 24C when the switch 22SW in the variable filter 24C is on and the bandpass characteristic of the variable filter 24D when the switch 22SW is on.

As illustrated in FIG. 15, when both the switches 22SW1 and 22SW2 are off, in contrast, the impedance characteristic of the parallel-arm circuit 120E is a characteristic that is affected by the capacitors 22C1 and 22C2. That is, in this state, the combined characteristic of the two parallel-arm resonators (the parallel-arm resonators 22p1 and 22p2) and the capacitors 22C1 and 22C2 ("combined characteristic of parallel-arm (22p1+22p2+22C1+22C2)" in FIG. 15) corresponds to the impedance characteristic of the parallel-arm circuit.

Specifically, when both the switches 22SW1 and 22SW2 are off, the parallel-arm circuit 120E has the following impedance characteristic.

The parallel-arm circuit 120E has two resonant frequencies fr1off and fr2off and two anti-resonant frequencies fa1off and fa2off (in this case, fr1off<fa1off<fr2off<fa2off, fa1off<fap1, frp1<fr1off, frp2<fr2off, and fa2off<fap2 are satisfied). That is, the impedance of the parallel-arm circuit 120E reaches a local minimum at (i) a frequency higher than the resonant frequency of the parallel-arm resonator 22p1 included in the parallel-arm circuit 120E and at (ii) a frequency higher than the resonant frequency of the parallel-arm resonator 22p2. Further, the impedance of the parallel-arm circuit 120E reaches a local maximum at (i) a frequency between the resonant frequencies of the parallel-arm resonators 22p1 and 22p2 included in the parallel-arm circuit 120E and at (ii) a frequency between the anti-resonant frequencies of the two parallel-arm resonators 22p1 and 22p2.

The reasons for these and the specific mechanisms are similar to those for the parallel-arm circuits 120A and 120D described above, and will not be described herein.

That is, when the switch 22SW is off, the variable filter 24E has a bandpass characteristic in which the pass band is defined by the anti-resonant frequency fa1off and the resonant frequency frs, the pole (attenuation pole) on the low-frequency side of the pass band is defined by the resonant frequency fr1off, and the pole (attenuation pole) on the high-frequency side of the pass band is defined by the resonant frequency fr2off and the anti-resonant frequency fas.

Then, the impedance characteristics and bandpass characteristics of the variable filter 24E when both the switches 22SW1 and 22SW2 are on and off are compared in detail.

As illustrated in FIG. 15, when both the switches 22SW1 and 22SW2 are switched from on to off, the impedance characteristic of the parallel-arm circuit 120E changes in the following manner. In the parallel-arm circuit 120E, both the two resonant frequencies and the lower anti-resonant frequency among the two anti-resonant frequencies shift to higher ranges. In this embodiment, the parallel-arm resonators 22p1 and 22p2 are connected in series with the capacitors 22C1 and 22C2, respectively. Thus, both the two resonant frequencies shift to higher ranges (portions J and K in FIG. 15). In addition, the lower anti-resonant frequency shifts to a higher range (portion I in FIG. 15).

The lower anti-resonant frequency and the higher resonant frequency of the parallel-arm circuit, which define the attenuation slope on the high-frequency side of the pass band of the variable filter 24E, shift to higher ranges, as described above. Further, the lower anti-resonant frequency and the lower resonant frequency of the parallel-arm circuit, which define the attenuation slope on the low-frequency side of the pass band of the variable filter 24E, shift to higher ranges, as described above. Thus, as depicted in a lower portion of FIG. 15, both the switches 22SW1 and 22SW2 are switched from on to off, thereby shifting the bandpass characteristic of the variable filter 24E to a higher range while maintaining the steepness of the attenuation slopes on the high-frequency side of the pass band and on the low-frequency side of the pass band (see the solid black arrows in FIG. 15). In other words, the variable filter 24E can shift the bandpass characteristic to a higher range (portion L in FIG. 15) with the appearance of shoulders on the high-frequency side of the pass band and on the low-frequency side of the pass band while shifting the attenuation poles on the high-frequency side of the pass band and on the low-frequency side of the pass band to higher ranges (portions N and M in FIG. 15). Thus, for example, the variable filter 24E can shift the center frequency while maintaining the band width.

The variable filter 24E may not necessarily turn on/off the switches 22SW1 and 22SW2 together, and may turn on/off the switches 22SW1 and 22SW2 separately. However, turning on/off the switches 22SW1 and 22SW2 together can reduce the number of control lines to control the switches 22SW1 and 22SW2, achieving a simplified configuration of the variable filter 24E.

In contrast, turning on/off the switches 22SW1 and 22SW2 separately can provide more various pass bands that can be switched by the variable filter 24E.

Specifically, as described for the variable filter 24C, the high-frequency end of the pass band can be varied in accordance with the turning on and off of the switch 22SW1 connected in series with the parallel-arm resonator 22p1. As described for the variable filter 24D, furthermore, the low-frequency end of the pass band can be varied in accordance with the turning on and off of the switch 22SW2 connected in series with the parallel-arm resonator 22p2.

Thus, the low-frequency end and the high-frequency end of the pass band can be shifted to a lower range or a higher range by turning on or off both the switches 22SW1 and 22SW2. That is, the center frequency of the pass band can be shifted to a lower range or a higher range. In addition, by switching one of the switches 22SW1 and 22SW2 from on to off and switching the other of the switches 22SW1 and 22SW2 from off to on, both the low-frequency end and the high-frequency end of the pass band can be shifted so as to increase or reduce the frequency difference. That is, the width of the pass band can be varied with the center frequency of the pass band kept substantially constant. Additionally, while one of the switches 22SW1 and 22SW2 is held on or off, the other switch may be turned on and off to shift one of the low-frequency end and the high-frequency end of the pass band to a lower range or a higher range while fixing the other frequency end. That is, the low-frequency end or the high-frequency end of the pass band can be changed.

Accordingly, the provision of the capacitors 22C1 and 22C2 and the switches 22SW1 and 22SW2 can enhance the flexibility of varying the pass band.

[2.10 Modifications of Other Variable Filters]

The configuration of the variable filter 24A or 24B included in the filter device 11 according to this embodiment is not limited to the configurations of the variable filters 24C, 24D, and 24E described above. The following describes other modifications of the variable filter 24A or 24B.

Figure 16A:
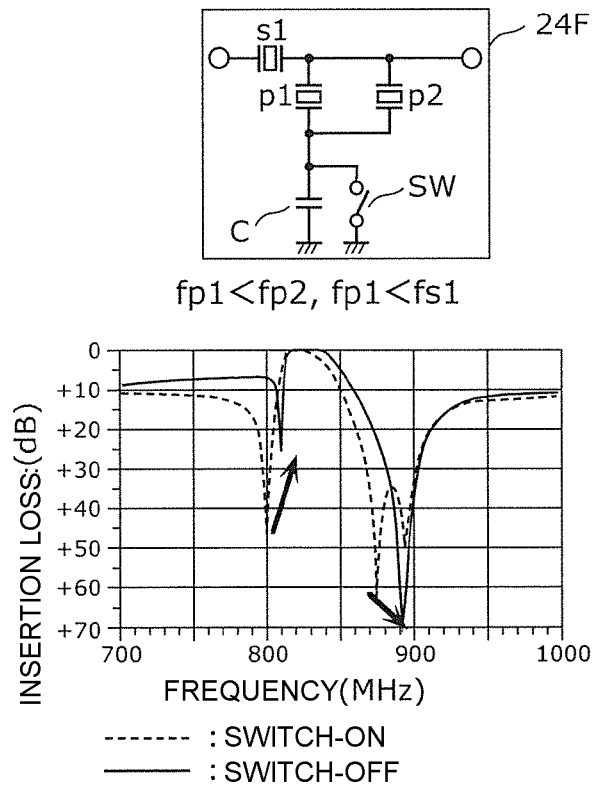
FIG. 16A illustrates a circuit configuration diagram of a variable filter according to Modification 3 of Embodiment 2 and a graph illustrating a comparison of bandpass characteristics during a switch-on period and a switch-off period.

FIG. 16A illustrates a circuit configuration diagram of a variable filter 24F according to Modification 3 of Embodiment 2 and a graph illustrating a comparison of bandpass characteristics during a switch-on period and a switch-off period. As illustrated in FIG. 16A, in the variable filter 24F according to this modification, parallel-arm resonators p1 and p2 are connected in parallel to each other and connected to a series arm of a series-arm resonator s1. Further, a capacitor C and a switch SW are connected in parallel to each other and connected to a connection node of the parallel-arm resonators p1 and p2. The parallel-arm resonator p1 has a lower resonant frequency fp1 than each of a resonant frequency fp2 of the parallel-arm resonator p2 and a resonant frequency fs1 of the series-arm resonator s1. Accordingly, the switch SW is switched from the on state to the off state to shift the attenuation pole on the low-frequency side of the pass band and the attenuation pole on the high-frequency side of the pass band to higher frequency ranges. Therefore, the bandpass characteristic of the variable filter 24F can be changed.

Figure 16B:
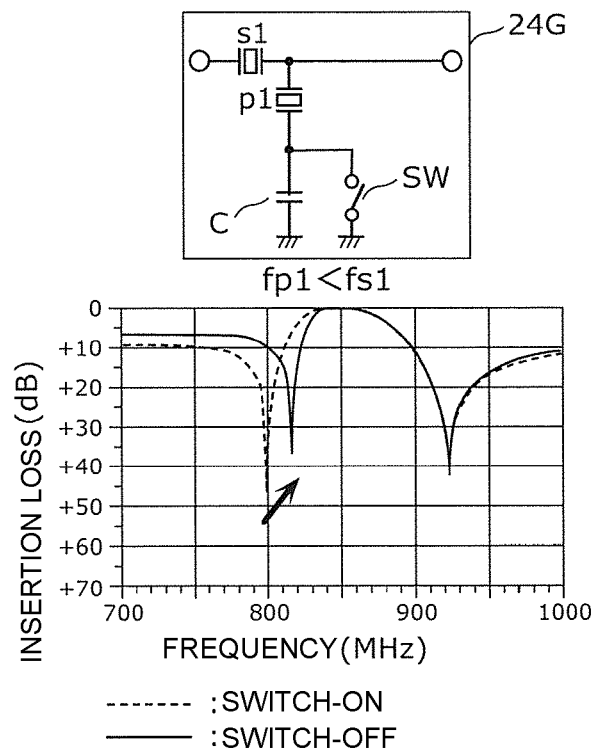
FIG. 16B illustrates a circuit configuration diagram of a variable filter according to Modification 4 of Embodiment 2 and a graph illustrating a comparison of bandpass characteristics during a switch-on period and a switch-off period.

FIG. 16B illustrates a circuit configuration diagram of a variable filter 24G according to Modification 4 of Embodiment 2 and a graph illustrating a comparison of bandpass characteristics during a switch-on period and a switch-off period. As illustrated in FIG. 16B, in the variable filter 24G according to this modification, a parallel-arm resonator p1 is connected to a series arm of a series-arm resonator s1. Further, a capacitor C and a switch SW are connected in parallel to each other between the parallel-arm resonator p1 and ground. The parallel-arm resonator p1 has a lower resonant frequency fp1 than a resonant frequency fs1 of the series-arm resonator s1. Accordingly, the switch SW is switched from the on state to the off state to shift the attenuation pole on the low-frequency side of the pass band to a higher frequency range. Therefore, the bandpass characteristic of the variable filter 24G can be changed.

Figure 16C:
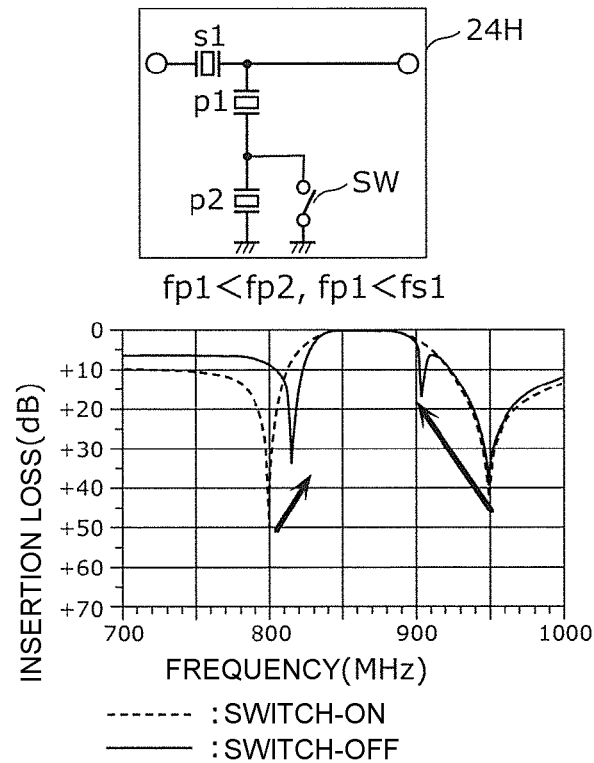
FIG. 16C illustrates a circuit configuration diagram of a variable filter according to Modification 5 of Embodiment 2 and a graph illustrating a comparison of bandpass characteristics during a switch-on period and a switch-off period.

FIG. 16C illustrates a circuit configuration diagram of a variable filter 24H according to Modification 5 of Embodiment 2 and a graph illustrating a comparison of bandpass characteristics during a switch-on period and a switch-off period. As illustrated in FIG. 16C, in the variable filter 24H according to this modification, parallel-arm resonators p1 and p2 are connected in series with each other and connected to a series arm of a series-arm resonator s1. Further, a switch SW is connected between a connection node of the parallel-arm resonators p1 and p2 and ground. The parallel-arm resonator p1 has a lower resonant frequency fp1 than each of a resonant frequency fp2 of the parallel-arm resonator p2 and a resonant frequency fs1 of the series-arm resonator s1. Accordingly, the switch SW is switched from the on state to the off state to shift the attenuation pole on the low-frequency side of the pass band to a higher frequency range and the attenuation pole on the high-frequency side of the pass band to a lower frequency range. Therefore, the bandpass characteristic of the variable filter 24H can be changed.

Figure 16D:
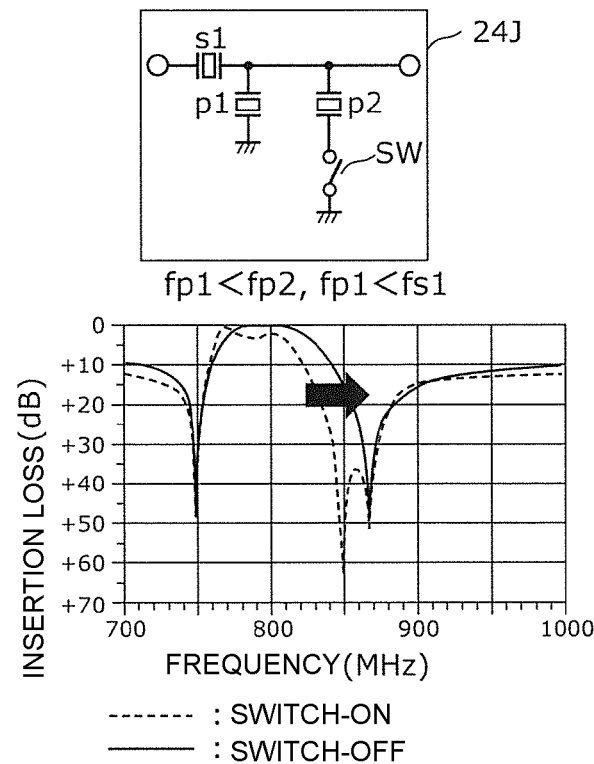
FIG. 16D illustrates a circuit configuration diagram of a variable filter according to Modification 6 of Embodiment 2 and a graph illustrating a comparison of bandpass characteristics during a switch-on period and a switch-off period.

FIG. 16D illustrates a circuit configuration diagram of a variable filter 24J according to Modification 6 of Embodiment 2 and a graph illustrating a comparison of bandpass characteristics during a switch-on period and a switch-off period. As illustrated in FIG. 16D, in the variable filter 24J according to this modification, parallel-arm resonators p1 and p2 are connected in parallel to each other and connected to a series arm of a series-arm resonator s1. Further, a switch SW is connected between the parallel-arm resonator p2 and ground. The parallel-arm resonator p1 has a lower resonant frequency fp1 than each of a resonant frequency fp2 of the parallel-arm resonator p2 and a resonant frequency fs1 of the series-arm resonator s1. Accordingly, the switch SW is switched from the on state to the off state to shift the slope on the high-frequency side of the pass band to a higher frequency range. Therefore, the pass band of the variable filter 24J can be changed.

Figure 16E:
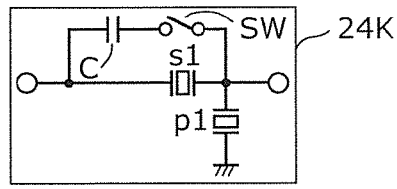
FIG. 16E illustrates a circuit configuration diagram of a variable filter according to Modification 7 of Embodiment 2 and a graph illustrating a comparison of bandpass characteristics during a switch-on period and a switch-off period.
Figure 16E:
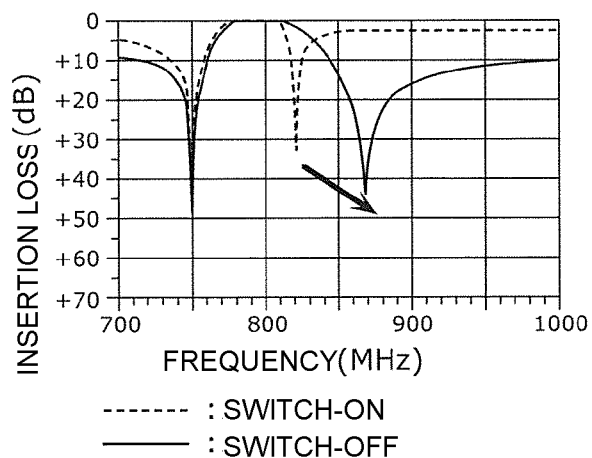

FIG. 16E illustrates a circuit configuration diagram of a variable filter 24K according to Modification 7 of Embodiment 2 and a graph illustrating a comparison of bandpass characteristics during a switch-on period and a switch-off period. As illustrated in FIG. 16E, in the variable filter 24K according to this modification, a parallel-arm resonator p1 is connected to a series arm of a series-arm resonator s1. Further, a series-connected circuit of a capacitor C and a switch SW is connected in parallel to the series-arm resonator s1. The parallel-arm resonator p1 has a lower resonant frequency fp1 than a resonant frequency fs1 of the series-arm resonator s1. Accordingly, the switch SW is switched from the on state to the off state to shift the attenuation pole on the high-frequency side of the pass band to a higher frequency range. Therefore, the bandpass characteristic of the variable filter 24K can be changed.

Figure 16F:
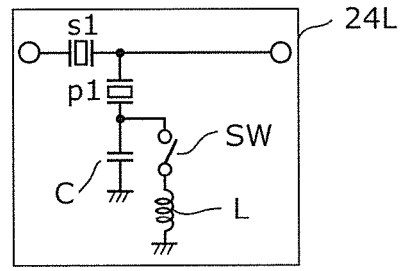
FIG. 16F illustrates a circuit configuration diagram of a variable filter according to Modification 8 of Embodiment 2 and a graph illustrating a comparison of bandpass characteristics during a switch-on period and a switch-off period.
Figure 16F:
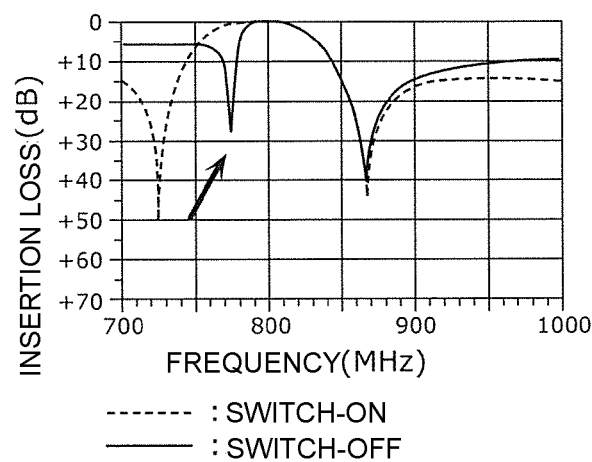

FIG. 16F illustrates a circuit configuration diagram of a variable filter 24L according to Modification 8 of Embodiment 2 and a graph illustrating a comparison of bandpass characteristics during a switch-on period and a switch-off period. As illustrated in FIG. 16F, in the variable filter 24L according to this modification, a parallel-arm resonator p1 is connected to a series arm of a series-arm resonator s1. Further, a capacitor C and a series-connected circuit of a switch SW and an inductor L are connected in parallel to each other between the parallel-arm resonator p1 and ground. The parallel-arm resonator p1 has a lower resonant frequency fp1 than a resonant frequency fs1 of the series-arm resonator s1. Accordingly, the switch SW is switched from the on state to the off state to shift the attenuation pole on the low-frequency side of the pass band to a higher frequency range. Therefore, the bandpass characteristic of the variable filter 24L can be changed.

The variable filter 24A or 24B included in the filter device 11 according to this embodiment is not necessarily constituted by a plurality of elastic wave resonators. A variable filter according to this embodiment may be a filter including an LC resonator or a dielectric resonator.

Figure 17:
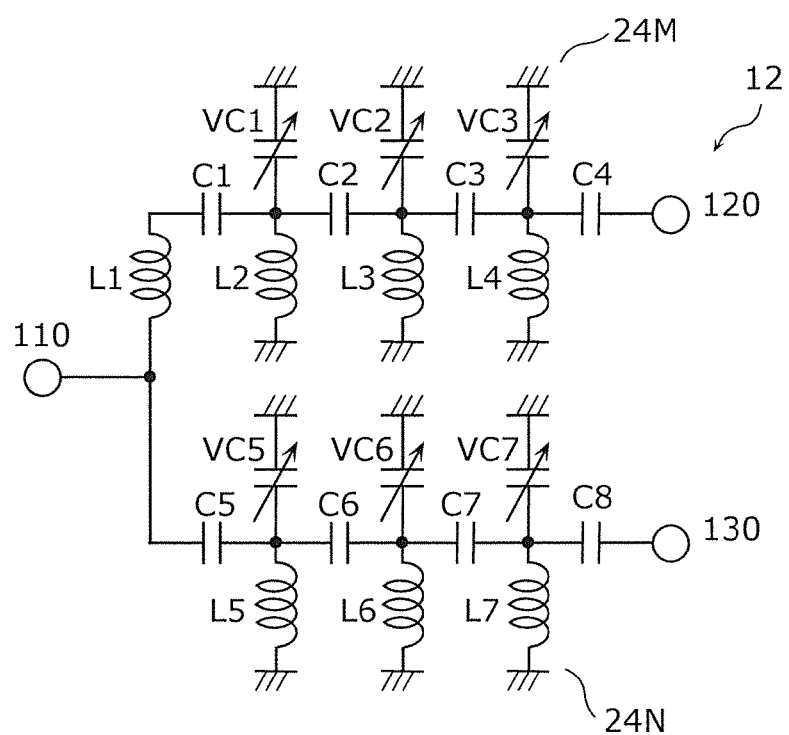
FIG. 17 is a circuit configuration diagram of a variable filter according to Modification 9 of Embodiment 2.

FIG. 17 is a circuit configuration diagram of a filter device 12 according to Modification 9 of Embodiment 2. As illustrated in FIG. 17, the filter device 12 according to this modification includes variable filters 24M and 24N. Although not illustrated in FIG. 17, a switch is arranged in the preceding or subsequent stage of the variable filters 24M and 24N to select the variable filter 24M or 24N. The variable filters 24M and 24N are each constituted by an LC resonant circuit. The variable filter 24M is constituted by capacitors C1 to C4, variable capacitors VC1 to VC3, and inductors L1 to L4. The variable filter 24N is constituted by capacitors C5 to C8, variable capacitors VC5 to VC7, and inductors L5 to L7.

The variable filter according to this modification may be a variable filter including a dielectric resonator, instead of the LC resonant circuit illustrated in FIG. 17. Accordingly, it is possible to provide a variable filter having a wide pass band.

Embodiment 3

This embodiment illustrates a configuration in which the filter device according to Embodiment 1 or 2 is applied to a diversity module.

Figure 18A:
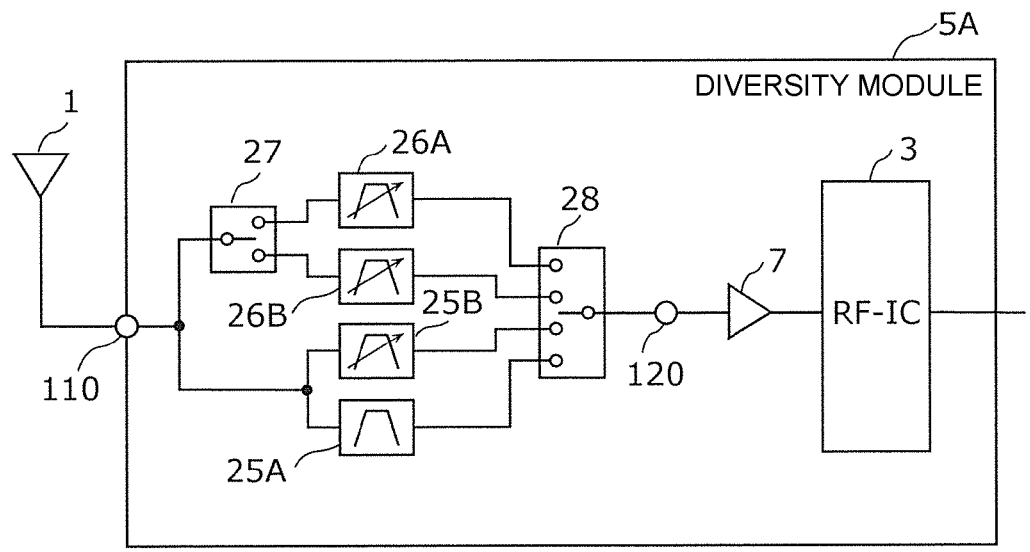
FIG. 18A is a circuit configuration diagram of a diversity module according to Embodiment 3.

FIG. 18A is a circuit configuration diagram of a diversity module 5A according to Embodiment 3. The diversity module 5A illustrated in FIG. 18A includes a filter 25A, variable filters 25B, 26A, and 26B, switches 27 and 28, a reception amplifier circuit 7, and an RF signal processing circuit (RFIC) 3.

The filter 25A has a filter characteristic in which the pass band is set to the reception band of Band 8 (925-960 MHz).

The variable filter 25B is a filter capable of changing the filter characteristic to a filter characteristic A in which the pass band is set to the reception band of Band 27 (852-869 MHz) or a filter characteristic B in which the pass band is set to the reception band of Band 26 (859-894 MHz). The transmission band of Band 8 (880-915 MHz), which is the attenuation band of the filter 25A, and the reception band of Band 26 (859-894 MHz), which is the pass band of the variable filter 25B, partially overlap in frequency. Thus, the filter 22A and the variable filter 22B according to Embodiment 1 can be applied to the filter 25A and the variable filter 25B, respectively. This can eliminate the need to arrange a switch in the preceding stage of the filter 25A and the variable filter 25B to maintain the isolation.

The variable filter 26A is a filter capable of changing the filter characteristic to a filter characteristic C in which the pass band is set to the reception band of Band (29+14) or a filter characteristic D in which the pass band is set to the reception band of Band (12+14).

The variable filter 26B is a filter capable of changing the filter characteristic to a filter characteristic E in which the pass band is set to the reception band of Band 68 or a filter characteristic F in which the pass band is set to the reception band of Band (28+20).

The switch 27 is a switch circuit for switching between the connection of the variable filter 26A and the common terminal 110 to each other and the connection of the variable filter 26B and the common terminal 110 to each other.

The switch 28 is a switch circuit for connecting any one of the filter 25A and the variable filters 26A, 26B, and 25B to the reception amplifier circuit 7.

With the configuration described above, when the filter 25A is selected by the switch 28, a characteristic for which the insertion loss within the overlapping region is greater is selected in the variable filter 25B although the variable filter 25B is not selected. Thus, the attenuation characteristic of the filter 25A within the overlapping band can be prevented from deteriorating due to the effect of leaking signals into the variable filter 25B. In addition, no need exists to increase the size of the switch circuit to enhance the isolation more than necessary. This can achieve a reduction in size while maintaining the attenuation characteristic of the filter 25A.

Figure 18B:
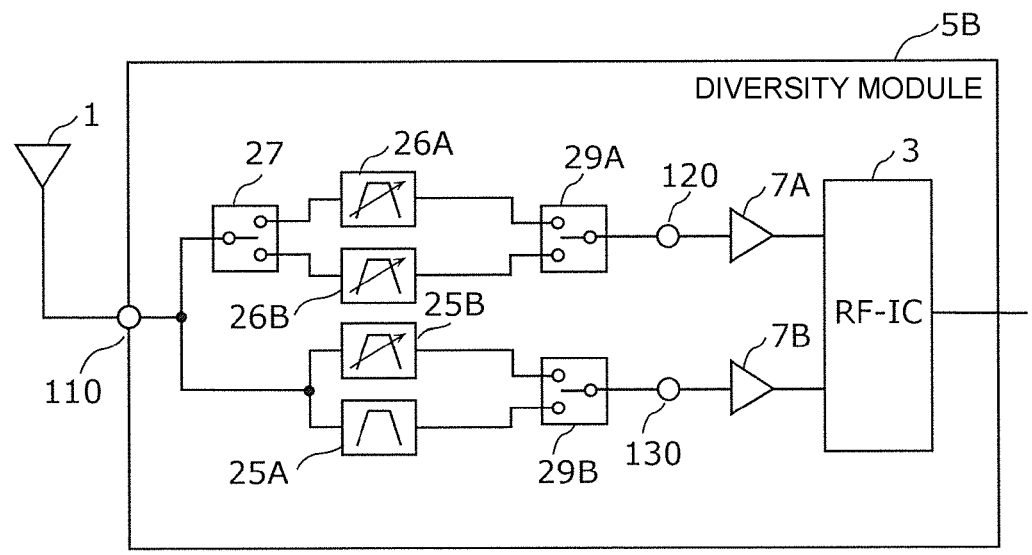
FIG. 18B is a circuit configuration diagram of a diversity module according to Modification 1 of Embodiment 3.

FIG. 18B is a circuit configuration diagram of a diversity module 5B according to Modification 1 of Embodiment 3. In the diversity module 5B according to this modification, unlike the diversity module 5A according to Embodiment 3, the diversity module 5B is configured to support carrier aggregation. The following describes the diversity module 5B according to this modification, focusing on different points from the diversity module 5A. The diversity module 5B illustrated in FIG. 18B includes a filter 25A, variable filters 25B, 26A, and 26B, switches 27, 29A, and 29B, reception amplifier circuits 7A and 7B, and an RF signal processing circuit (RFIC) 3.

The switch 29A is a switch circuit for connecting the variable filter 26A or 26B to the reception amplifier circuit 7A. The switch 29B is a switch circuit for connecting the filter 25A or the variable filter 25B to the reception amplifier circuit 7B.

With the configuration described above, the variable filter 26A or 26B and the filter 25A or the variable filter 25B can be simultaneously selected. Also, in this configuration, the attenuation characteristic of the filter 25A within the overlapping band can be prevented from deteriorating due to the effect of leaking signals into the variable filter 25B. In addition, no need exists to increase the size of the switch circuit to enhance the isolation more than necessary. This can achieve a reduction in size while maintaining the attenuation characteristic of the filter 25A.

Figure 19:
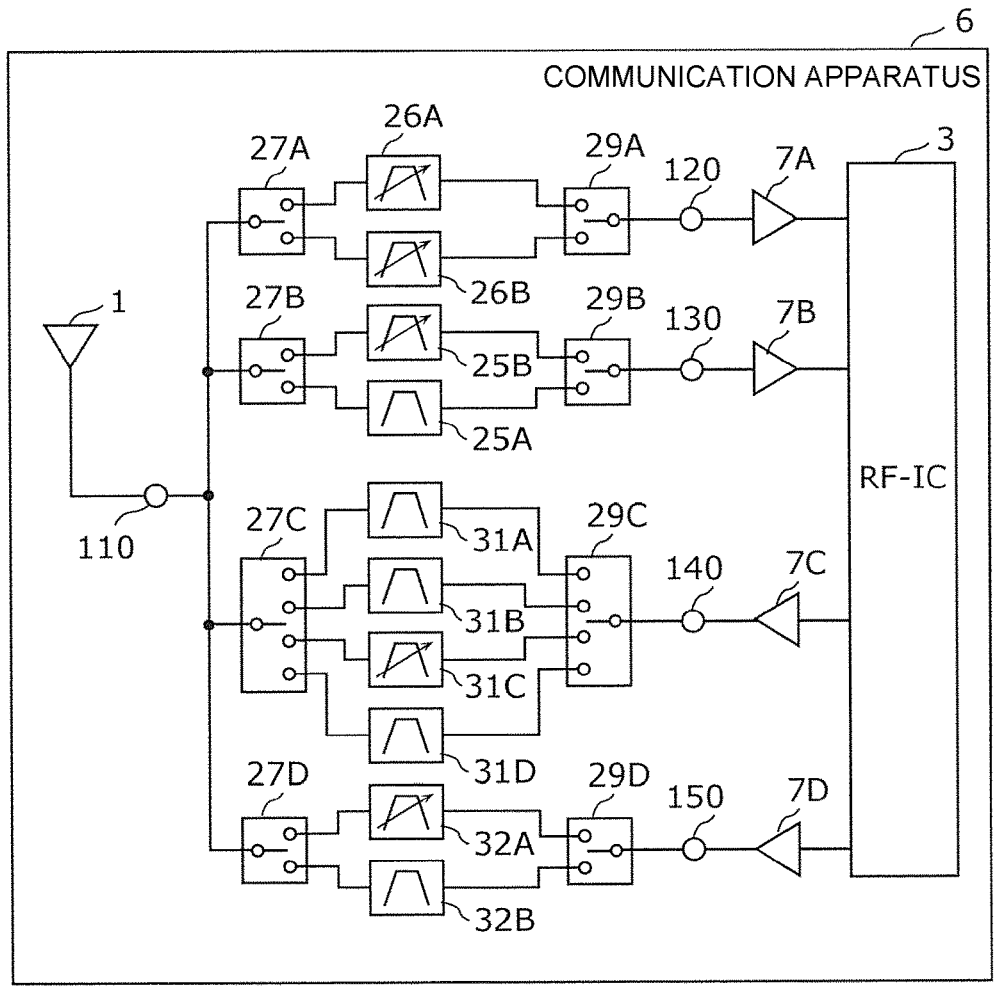
FIG. 19 is a circuit configuration diagram of a communication apparatus according to Modification 2 of Embodiment 3.
Figure 20:
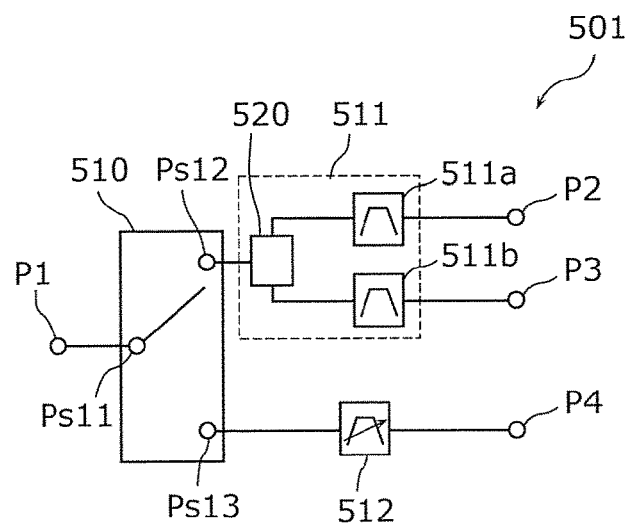
FIG. 20 is a circuit configuration diagram of a branching device described in Patent Document 1.

FIG. 19 is a circuit configuration diagram of a communication apparatus 6 according to Modification 2 of Embodiment 3. In the communication apparatus 6 according to this modification, unlike the diversity module 5B according to Modification 1, both a transmission-side circuit and a reception-side circuit are arranged. The following description focuses on different points from the diversity module 5B according to Modification 1, with the description of the same points omitted.

In addition to the configuration of the diversity module 5B according to Modification 1, the communication apparatus 6 further includes switches 27B, 27C, 27D, 29C, and 29D, filters 31A, 31B, 31D, and 32B, variable filters 31C and 32A, transmission amplifier circuits 7C and 7D, and an antenna element 1.

The filter 31A has a filter characteristic in which the pass band is set to the transmission band of Band 12.

The filter 31B has a filter characteristic in which the pass band is set to the transmission band of Band (13+14).

The filter 31D has a filter characteristic in which the pass band is set to the transmission band of Band 20.

The filter 32B has a filter characteristic in which the pass band is set to the transmission band of Band 8.

The variable filter 31C is a filter capable of changing the filter characteristic to a filter characteristic in which the pass band is set to the transmission band of Band 68, a filter characteristic in which the pass band is set to the transmission band of Band 28a, or a filter characteristic in which the pass band is set to the transmission band of Band 28b.

The variable filter 32A is a filter capable of changing the filter characteristic to a filter characteristic in which the pass band is set to the transmission band of Band 27 or a filter characteristic in which the pass band is set to the transmission band of Band 26.

A configuration having the transmission/reception circuit described above also eliminates the need to increase the size of the switch circuits to enhance the isolation more than necessary, enabling a reduction in size while maintaining the bandpass characteristic and attenuation characteristic of each filter.

Other Embodiments, etc.

While a filter device, a radio-frequency front-end circuit, and a communication apparatus according to embodiments of the present disclosure have been described with reference to Embodiments 1 to 3 and modifications, a filter device, a radio-frequency front-end circuit, and a communication apparatus of the present disclosure are not limited to those in the embodiments and modifications described above. Any of the constituent elements in the embodiments and modifications described above may be combined to implement other embodiments, or various modifications conceived of by a person skilled in the art without departing from the gist of the present disclosure may be made to the embodiments. Such embodiments and modifications and various devices including a filter device, a radio-frequency front-end circuit, and a communication apparatus disclosed herein are also included in the present disclosure.

The filter device, the radio-frequency front-end circuit, and the communication apparatus according to Embodiments 1 to 3 and the modifications described above have been described as being applied to a system that switches adjacent frequency bands, and can also be applied to a system that exclusively switches a plurality of adjacent channels allocated in a single frequency band.

In the filter device, the radio-frequency front-end circuit, and the communication apparatus according to Embodiments 1 to 3 and the modifications described above, an inductor or a capacitor may further be connected between terminals such as an input terminal, an output terminal, and a common terminal.

While Embodiments 1 and 2 describe a filter device, taking as an example a two-channel demultiplexing/multiplexing circuit in which two reception signal paths are connected to a common terminal, the present disclosure can also be applied to, for example, a circuit including both a transmission path and a reception path or a demultiplexing/multiplexing circuit in which three or more signal paths are connected to a common terminal.

The present disclosure provides a compact filter device, radio-frequency front-end circuit, and communication apparatus applicable to a multi-band and multi-mode system, which can be widely used for communication devices such as cellular phones.

1 antenna element
$1c11, 1c12, 1c21, 1c22, 1c31, 1c32, 2c11, 2c12, 2c21, 2c22, 2c31, 2c32, 22C, 22C1, 22C2$ capacitor
$1p11, 1p12, 1p21, 1p22, 1p31, 1p32, 2p11, 2p12, 2p21, 2p22, 2p31, 2p32, 22p1, 22p2$ parallel-arm resonator
$1s1, 1s2, 1s3, 1s4, 2s1, 2s2, 2s3, 2s4, 22s$ series-arm resonator
$1s11, 1s12, 1s21, 1s22, 1s31, 1s32, 23, 2s11, 2s12, 2s21, 2s22, 2s31, 2s32, 22SW, 22SW1, 22SW2, 27, 27A, 27B, 27C, 27D, 28, 29A, 29B, 29C, 29D, 510$ switch
2, 7, 7A, 7B reception amplifier circuit
3 RF signal processing circuit (RFIC)
4 radio-frequency front-end circuit
5, 6 communication apparatus
5A, 5B diversity module
7C, 7D transmission amplifier circuit 10, 10X, 10Y, 11, 12 filter device
11a, 11b, 104 IDT electrode
21 matching circuit
22A, 25A, 31A, 31B, 31D, 32B, 511a, 511b filter
22B, 24A, 24B, 24C, 24D, 24E, 24F, 24G, 24H, 24J, 24K, 24L, 24M, 24N, 25B, 26A, 26B, 31C, 32A, 512 variable filter
22m, 22n input/output terminal
23, 23M, 23N, 23Y switch
23X switch circuit
23a, 23b, 23e, 23f selection terminal
23c, 23d common switch terminal
23s, 23t, 23u, 23v terminal
100 piezoelectric substrate
101 close contact layer
102 main electrode layer
103 protection layer
110 common terminal
110a, 110b electrode fingers
111a, 111b busbar electrode
120, 120M, 120N output terminal
120A, 120D, 120E parallel-arm circuit
241, 243 input end
242, 244 output end
501 branching device
511 fixed filter circuit
520 impedance matching circuit

The invention claimed is:

1. A filter device having a common terminal, a first input/output terminal, and a second input/output terminal, comprising:
a first filter arranged between the common terminal and the first input/output terminal, the first filter having a first characteristic of a first pass band and a predetermined attenuation band;
a second filter arranged between the common terminal and the second input/output terminal, the second filter being capable of changing between a second characteristic and a third characteristic; and
a switch circuit configured to switch a connection of the common terminal with the first filter and the first input/output terminal or with the second filter and the second input/output terminal, wherein
when the second filter has the second characteristic, the second filter has a second pass band that at least partially overlaps the first pass band or the predetermined attenuation band,
when the second filter has the third characteristic, insertion loss for frequencies within the overlapping portion of the second pass band is greater than when the second filter has the second characteristic, and
the second filter has the third characteristic when the common terminal, the first filter, and the first input/output terminal are connected to each other by the switch circuit.

2. The filter device according to claim 1, wherein
the first pass band is a transmission band or a reception band of the first filter,
the predetermined attenuation band is the other of the transmission band or the reception band of the first filter, and
the overlapping portion of the second frequency band at least partially overlaps with the other of the transmission band or the reception band of the first filter.

3. The filter device according to claim 1, wherein the second filter has the third characteristic when the common terminal, the first filter, and the first input/output terminal are connected to each other by the switch circuit, and has the second characteristic when the common terminal, the second filter, and the second input/output terminal are connected to each other by the switch circuit.

4. The filter device according to claim 1, wherein when the second filter has the third characteristic, the second filter has a pass band that is different from the second pass band such that the insertion loss for frequencies within the overlapping portion of the second pass band is greater than when the second filter has the second characteristic.

5. The filter device according to claim 1, wherein the first filter is a variable filter capable of changing a characteristic to one different from the first characteristic.

6. The filter device according to claim 1, wherein:
the second filter comprises:
a series-arm resonator connected on a path connecting the common terminal to the second input/output terminal, and
a parallel-arm circuit connected between ground and a node on the path connecting the common terminal to the second input/output terminal,
the parallel-arm circuit comprises:
a parallel-arm resonator connected between the node and ground, and
an impedance element and a switch element that are connected in parallel to each other,
the parallel connection of the impedance element and the switch element is connected in series with the parallel-arm resonator between the node and ground, and
the second filter is changed between having the second characteristic and the third characteristic by shifting at least one of a frequency at which impedance of the parallel-arm circuit reaches a local minimum and a frequency at which the impedance reaches a local maximum in accordance with connection or disconnection of the switch element.

7. The filter device according to claim 1, wherein:
the second filter comprises:
a series-arm resonator connected on a path connecting the common terminal to the second input/output terminal, and
a parallel-arm circuit connected between ground and a node on the path connecting the common terminal to the second input/output terminal,
the parallel-arm circuit comprises:
a parallel-arm resonator connected between the node and ground, and
a switch element connected in series with the parallel-arm resonator between the node and ground, and
the second filter is changed between having the second characteristic and the third characteristic by switching impedance of the parallel-arm circuit in accordance with connection or disconnection of the switch element.

8. The filter device according to claim 1, wherein:
the second filter comprises
a series-arm circuit connected between the common terminal and the second input/output terminal, and
a parallel-arm resonator connected between ground and a node on a path connecting the common terminal to the second input/output terminal,
the series-arm circuit comprises:
a series-arm resonator connected between the common terminal and the second input/output terminal,
an impedance element and a switch element that are connected in series with each other and that are connected in parallel to the series-arm resonator between the common terminal and the second input/output terminal, and the second filter is changed between having the second characteristic and the third characteristic by shifting a frequency at which impedance of the series-arm circuit reaches a local maximum in accordance with connection or disconnection of the switch element.

9. The filter device according to claim 6, wherein the second filter further comprises a longitudinally coupled filter circuit arranged between the common terminal and the second input/output terminal.

10. The filter device according to claim 6, wherein the impedance element is a variable capacitor or a variable inductor.

11. The filter device according to claim 6, wherein the switch element is a GaAs or CMOS FET switch or a diode switch.

12. The filter device according to claim 1, wherein the first filter or the second filter is a surface acoustic wave filter, a boundary acoustic wave filter, or an elastic wave filter that uses a Bulk Acoustic Wave (BAW).

13. The filter device according to claim 1, wherein the first filter or the second filter is a filter that includes an LC resonator or a dielectric resonator.

14. The filter device according to claim 1, wherein the switch circuit is arranged only either between the common terminal and the first and second filters or between the first and second filters and the first and second input/output terminals.

15. The filter device according to claim 1, wherein the switch circuit is arranged both between the common terminal and the first and second filters, and between the first and second filters and the first and second input/output terminals.

16. The filter device according to claim 1, wherein:
the second filter is capable of changing between the second characteristic, the third characteristic, and a fourth characteristic,
when the second filter has the fourth characteristic, the second filter has a fourth pass band that is different in from the second pass band, and the second filter has the third characteristic when the common terminal, the first filter, and the first input/output terminal are connected to each other by the switch circuit, and has the second characteristic or the fourth characteristic when the common terminal, the second filter, and the second input/output terminal are connected to each other by the switch circuit.

17. The filter device according to claim 16, wherein
the first filter is capable of changing a between the first characteristic and a fifth characteristic,
when the first filter has the fifth characteristic, the first filter has a fifth pass band that is different from the first pass band,
the first pass band is a reception band in a Long Term Evolution (LTE) Band 20+Band 28,
the second pass band is a reception band of LTE Band 26 or a reception band of LTE Band 27,
the fourth pass band is the other of the reception band of LTE Band 26 or the reception band of LTE Band 27, and the fifth pass band is a reception band of LTE Band 68.

18. A radio-frequency front-end circuit comprising:
an amplifier circuit connected to the first input/output terminal and the second input/output terminal and configured to amplify a radio-frequency signal; and
The filter device according to claim 1.

19. A communication apparatus comprising:
an RF signal processing circuit configured to process a radio-frequency signal that is transmitted from or received at an antenna element;
The filter device according to claim 1 configured to transmit the radio-frequency signal between the antenna element and the RF signal processing circuit; and
a controller configured to synchronously control switching between connection and disconnection of the switch circuit and switching the second filter between the first characteristic and the second characteristic.

* * * * *

UNITED STATES PATENT AND TRADEMARK OFFICE
CERTIFICATE OF CORRECTION

PATENT NO. : 10,715,112 B2
APPLICATION NO. : 16/278944
DATED : July 14, 2020
INVENTOR(S) : Koji Nosaka It is certified that error appears in the above-identified patent and that said Letters Patent is hereby corrected as shown below:

In the Specification

Column 18, Line 14:
"of Band (B68Rx)," should read "of Band 68 (B68Rx),"

In the Claims

Claim 18, Column 38, Line 26:
"The filter device" should read "the filter device"

Claim 18, Column 38, Line 31:
"The filter device" should read "the filter device"

Signed and Sealed this
Ninth Day of March, 2021

Drew Hirshfeld
*Performing the Functions and Duties of the
Under Secretary of Commerce for Intellectual Property and
Director of the United States Patent and Trademark Office*